United States Patent
Watanabe et al.

(10) Patent No.: US 6,527,852 B1
(45) Date of Patent: Mar. 4, 2003

(54) SEMICONDUCTOR CRYSTAL GROWING APPARATUS AND CRYSTAL GROWING METHOD

(75) Inventors: Masahito Watanabe, Tokyo (JP); Minoru Eguchi, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/762,469
(22) PCT Filed: Aug. 9, 1999
(86) PCT No.: PCT/JP99/04302
§ 371 (c)(1), (2), (4) Date: Apr. 18, 2001
(87) PCT Pub. No.: WO00/08238
PCT Pub. Date: Feb. 17, 2000

(30) Foreign Application Priority Data

Aug. 7, 1998 (JP) .......................... 10-224133
Aug. 7, 1998 (JP) .......................... 10-224134
Aug. 18, 1998 (JP) .......................... 10-231545

(51) Int. Cl.$^7$ .............................. C30B 15/20
(52) U.S. Cl. ................. 117/29; 117/30; 117/32; 117/917
(58) Field of Search ................. 117/13, 29, 30, 117/32, 917

(56) References Cited

U.S. PATENT DOCUMENTS 5,940,722 A * 8/1999 Tamura ....................... 438/471
6,077,346 A * 6/2000 Watanabe et al. ............. 117/32

FOREIGN PATENT DOCUMENTS

| DE | 198 57 339 A1 | 12/1998 |
| JP | 59035088 A | 2/1984 |
| JP | 61-63596 | 4/1986 |
| JP | 02217389 A | 8/1990 |
| JP | 05-85876 | 4/1993 |
| JP | 05-085876 | 4/1993 |
| JP | 07-257990 | 10/1995 |

OTHER PUBLICATIONS

German Office Action dated Jul. 15, 2002, with English translation.

Hoshikawa, et al., "Low Oxygen Content Czochralski Silicon Growth", Japanese Journal of Applied Physics, vol. 19, No. 1, Jan., 1980, pp. L33–36.

* cited by examiner

Primary Examiner—Felisa Hiteshew
(74) Attorney, Agent, or Firm—McGinn & Gibb, PLLC

(57) ABSTRACT

A semiconductor crystal growing apparatus includes a device for applying a magnetic field to inside a semiconductor melt and a device for passing a current through the semiconductor melt. An electrode for applying the current to the inside of the semiconductor melt extends through a tube surrounding the electrode.

33 Claims, 18 Drawing Sheets

SEMICONDUCTOR CRYSTAL GROWING APPARATUS AND CRYSTAL GROWING METHOD

This application is a 371 of PCT/JP99/04302 Aug. 09,1999.

TECHNICAL FIELD

The present invention relates to a semiconductor single crystal growing technology using Czochralski method, and more particularly to a semiconductor single crystal growing apparatus and growing method in which crystal growth is performed while a magnetic field and a current orthogonal to each other are applied to a semiconductor melt to rotate the semiconductor melt.

BACKGROUND ART

Semiconductor crystal wafers in use for the substrates of ultra high integrated electric devices are grown by Czochralski method in which a semiconductor single crystal is pulled up from a rotating semiconductor melt while it is rotated in the opposite direction. The semiconductor melt held in the crucible undergoes heat from a cylindrical heater installed around the crucible. The crucible is rotated so that the temperature distribution in the melt shows perfect axial symmetry about the pull axis of the crystal. Rendering the temperature distribution in the melt axially symmetrical requires that the center of rotation of the crucible and the symmetric axis of the heater arrangement coincide with the pull axis of the crystal. The conventional art typically employs a method of mechanically rotating a shaft that holds the crucible.

This crucible rotation changes the concentration of the impurities involved in the crystal. In the method of mechanically rotating the crystal and the crucible, however, the crystal rotation has become difficult with increasing crystal diameter; besides, rotating a crucible requires a system of considerable size. For such reasons, the growth of large crystals has become increasingly difficult.

In order to circumvent this difficulty, there has been proposed a semiconductor crystal growing apparatus and growing method comprising a device for applying a magnetic field to a semiconductor melt under crystal growth and a device for applying a current orthogonal to the above-mentioned magnetic field to the semiconductor melt, and wherein an electrode to be immersed into the semiconductor melt and an electrode for energizing the pulled crystal are used (Japanese Patent Application No.Hei 9-343261). This technology minimizes the increase in apparatus scale and allows precise control of the rotation rate even when a semiconductor crystal with a diameter as large as 30 cm or more is grown. In addition, Japanese Patent Application No.Hei 10-065174 has shown that the electrode material is made identical to the semiconductor single crystal to grow so that contamination to the growing crystal is avoided.

In the conventional art described above, however, the electrode was dissolved into the semiconductor melt over the course of crystal growth. In order to keep applying the current, the electrode needed to be moved with the crystal growth. Besides, when the electrode was put into contact with the semiconductor melt, the melt directly below the electrode was pulled up so that the contact was made at a position higher than the melt surface. Accordingly, there was another problem that the surface form of the melt between the electrode and the growing crystal changes to cause a drop in rotation symmetry.

Moreover, it was impossible in the above-mentioned conventional semiconductor single crystal growing technologies to monitor the rotation rate of the semiconductor melt under crystal growth with a high degree of accuracy and with facility.

Furthermore, in such methods as the conventional ones, of applying a magnetic field and a current of constant intensities to rotate the semiconductor melt, it was difficult to render a single piece of crystal uniform in the impurity distribution along the direction of growth, with variations of not greater than 1%. In particular, in the cases of silicon single crystals, it was difficult to distribute both oxygen and a dopant impurity uniformly at the same time. Thus, in the conventional methods, it was difficult to control the impurity concentrations in a crystal along the crystal pulling direction, and it was difficult to improve uniformity in the impurity distribution within a semiconductor single crystal along the direction of growth.

The present invention has been achieved in view of the foregoing problems. An object thereof (hereinafter, may be referred to as first object) is to provide a semiconductor single crystal growing technology using Czochralski method. comprising a semiconductor single crystal growing apparatus and growing method for applying a magnetic field to a semiconductor melt under crystal growth and passing a current orthogonal to the magnetic field through the semiconductor melt, and wherein an electrode need not be moved due to electrode dissolution during crystal growth, and any drop will not occur in the rotation symmetry of the semiconductor melt due to a deformation in the melt surface between the electrode and the growing crystal.

Moreover, another object of the present invention (hereinafter, may be referred to as second object) is to provide an apparatus and method which make it possible in the conventional crystal growing to accurately and easily monitor the rotation rate of a semiconductor melt that rotates under electromagnetic forces during crystal growth.

Furthermore, another object of the present invention (hereinafter, may be referred to as third object) is to provide an apparatus and method which make it possible in the conventional crystal growing to improve the uniformity in the impurity distribution within a semiconductor single crystal along the direction of crystal growth.

DISCLOSURE OF THE INVENTION

In order to achieve the first object described above, the present inventors have made thorough intensive study and found that the above-mentioned object can be achieved by the provision of a semiconductor crystal growing apparatus comprising a device for applying a magnetic field to inside a semiconductor melt and a device for passing a current through the semiconductor melt, wherein: a protective tube is arranged around an electrode for passing the current through the semiconductor melt; the material of the protective tube is made identical to that of a crucible holding the semiconductor melt; the protective tube and the melt are put into rectangular contact with each other; and the semiconductor melt and the electrode for passing the current through the semiconductor melt are put into contact with each other in the interior of the protective tube, at a position higher than the major surface of the melt surface, so that the semiconductor melt and the electrode for passing the current through the semiconductor melt are always in contact with each other during crystal growth and there occurs no deformation in the melt surface between the electrode and the crystal. Thereby has been achieved the present invention (hereinafter, may be referred to as first invention).

Thus, the first invention provides a semiconductor crystal growing apparatus comprising a device for applying a magnetic field to inside a semiconductor melt and a device for passing a current through the semiconductor melt, characterized in that an electrode for applying the current to inside the semiconductor melt extends through a tube surrounding the electrode.

The first invention also provides a semiconductor crystal growing method for growing a semiconductor crystal by using a semiconductor crystal growing apparatus comprising a device for applying a magnetic field to inside a semiconductor melt and a device for passing a current through the semiconductor melt, the method being characterized in that the semiconductor crystal growing apparatus has an electrode for applying the current to inside the semiconductor melt, the electrode extending through a tube surrounding the electrode.

In the first invention, a current is passed between the semiconductor melt held in a magnetic field and the growing semiconductor crystal, with the protective tube arranged around the electrode; therefore. the electrode and the melt come into contact with each other in the interior of the protective tube. Thus, even when the contact portion between the electrode and the melt increases in temperature during crystal growth, the melt rises inside the electrode, precluding the electrode and the melt from getting out of contact with each other. As a result, it becomes possible to keep applying the current without moving the electrode during crystal growth. Moreover, the material of the protective tube arranged around the electrode is made identical to that of the crucible holding the semiconductor melt so that the protective tube and the semiconductor melt come into rectangular contact with each other so as not to pull up the melt directly below the electrode. Therefore, the melt surface between the electrode and the growing crystal is not deformed any longer. This enhances the axial symmetry in temperature distribution, thereby making it possible to further uniformize the radial distribution of the dopant impurity concentration involved in the crystal. Furthermore, in the cases of silicon single crystals, the oxygen concentration distribution can also be rendered more uniform in radial distribution.

The present invention to achieve the foregoing second object (hereinafter, may be referred to as second invention) provides a semiconductor single crystal growing apparatus for performing semiconductor single crystal growth by Czoohralski method, comprising a device for applying a magnetic field to inside a semiconductor melt and a device for passing a current orthogonal to the magnetic field through the semiconductor melt, characterized in that a float for rotating with the melt is arranged on the surface of the semiconductor melt.

The second invention also provides a semiconductor single crystal growing method for performing semiconductor single crystal growth by Czochralskl method, characterized by using a semiconductor single crystal growing apparatus having a device for applying a magnetic field to inside a semiconductor melt and a device for passing a current orthogonal to the magnetic field through the semiconductor melt, a float for rotating with the melt being arranged on the surface of the semiconductor melt, and in that the movement of the float for rotating with the melt is detected to monitor the state of rotation of the semiconductor melt with the movement.

In the second invention, while a current is applied to between the semiconductor melt held in a magnetic field and the growing semiconductor single crystal and the semiconductor melt is rotated by electromagnetic forces for crystal growth. the rotation rate of the semiconductor melt can be monitored by virtue of the float that is floated on the melt surface. This makes it possible to obtain impurity concentrations in accordance with the rotation rates, as well as achieve a change in concentration in the middle of crystal growth.

In this case, the semiconductor single crystal growing apparatus may also suitably adopt the following configurations:

(A) A configuration in which the above-mentioned float has the shape of a ring.

(B) A configuration in which the above-mentioned ring-shaped float is arranged so that the growing crystal grows inside of the ring of the float.

(C) A configuration in which the material of the above-mentioned float is the same as that of a crucible holding the semiconductor melt.

(D) A configuration In which the above-mentioned ring-shaped float is provided with a deformed portion at the ring.

(E) A configuration in which the above-mentioned deformed portion is arranged on the outer periphery of the ring.

(F) A configuration in which the above-mentioned deformed portion is arranged on the top surface of the ring.

(G) A configuration in which the above-mentioned deformed portion is protruded from the ring.

(H) A configuration in which the above-mentioned deformed portion is a recess in the ring.

(J) A configuration in which the above-mentioned deformed portion is a hole piercing through the ring.

The present invention to achieve the foregoing third object (hereinafter, may be referred to as third invention) provides a semiconductor crystal growing apparatus using Czochralski method, comprising a device for applying a magnetic field and a current orthogonal to each other to inside a semiconductor melt, characterized by the provision of a magnetic field control unit for changing the magnetic field during crystal pulling and/or a current control unit for changing the current during crystal pulling.

The third invention also provides a semiconductor crystal growing method using Czochralski method, for applying a magnetic field and a current orthogonal to each other to inside a semiconductor melt, characterized in that the magnetic field applied and/or the current applied are/is changed during crystal growth.

In the third invention, while a current Is applied to between the semiconductor melt held in a magnetic field and the growing semiconductor single crystal and the semiconductor melt is rotated by electromagnetic forces for crystal growth, the intensity of the magnetic field and the value of the current to be applied is changed with the time of crystal growth so that the rotation rate of the melt can change with the crystal growth time, i.e. the pull length of the crystal, to offer an impurity concentration according to the rotation rate. Obtaining the relation between the rotation rate and the impurity concentration in advance makes it possible for variations in the impurity concentration resulting from segregation during the crystal growth to be compensated with variations of the rotation rate, so that the semiconductor single crystal is uniformized in impurity concentration distribution over the direction of growth.

In the third invention, the magnetic field applied and/or the current applied are/is suitably changed during the crystal growth in accordance with a crystal pull length or a crystal pull time. Moreover, a magnetic field signal parameter to change is appropriately the strength of the magnetic field, and a current signal parameter to change is the value of the current.

BEST MODES OF THE INVENTION

The embodiments of the first, second, and third inventions will be described.

Figure 1:
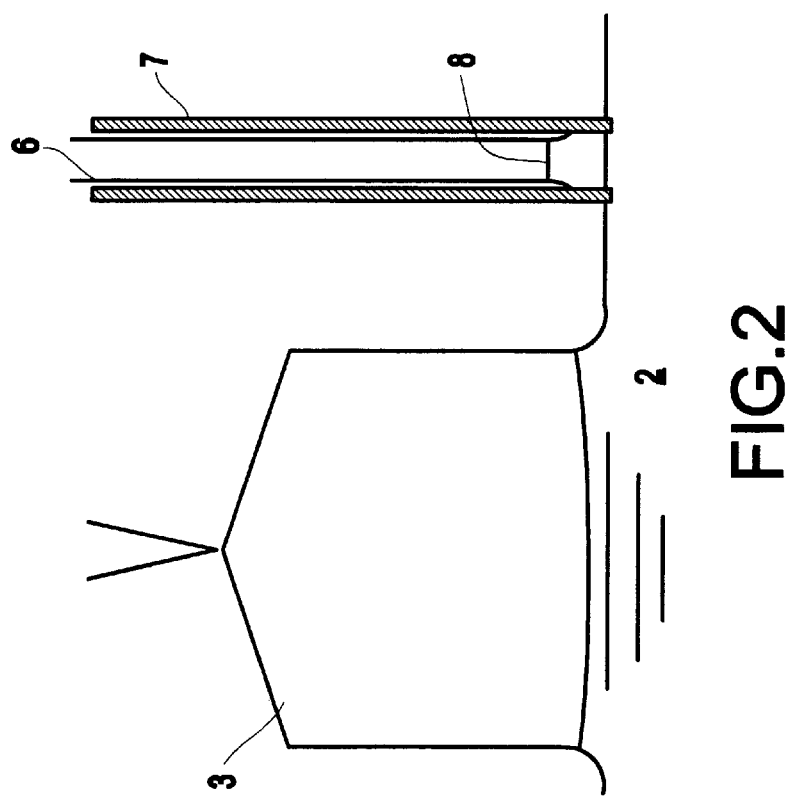
FIG. 1 is a diagram for illustrating the method of inserting an electrode and a protective tube in the case of growing a semiconductor single crystal by Czochralski method by using the first invention.
Figure 2:
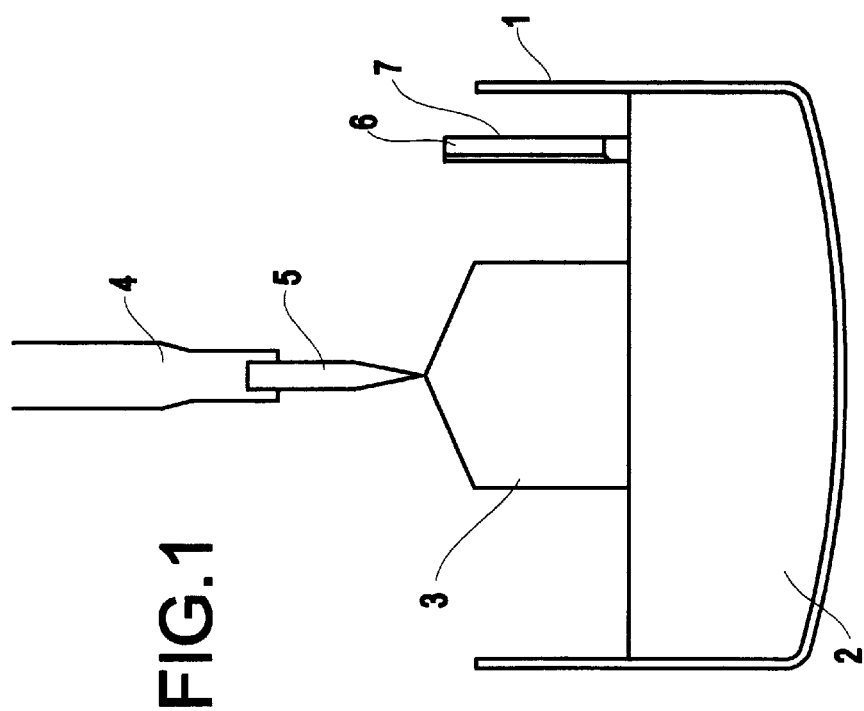
FIG. 2 is a diagram for illustrating the physical relationships among the electrode, the protective tube, and a semiconductor melt in the case of growing a semiconductor single crystal by Czochralski method by using the first invention.
Figure 3:
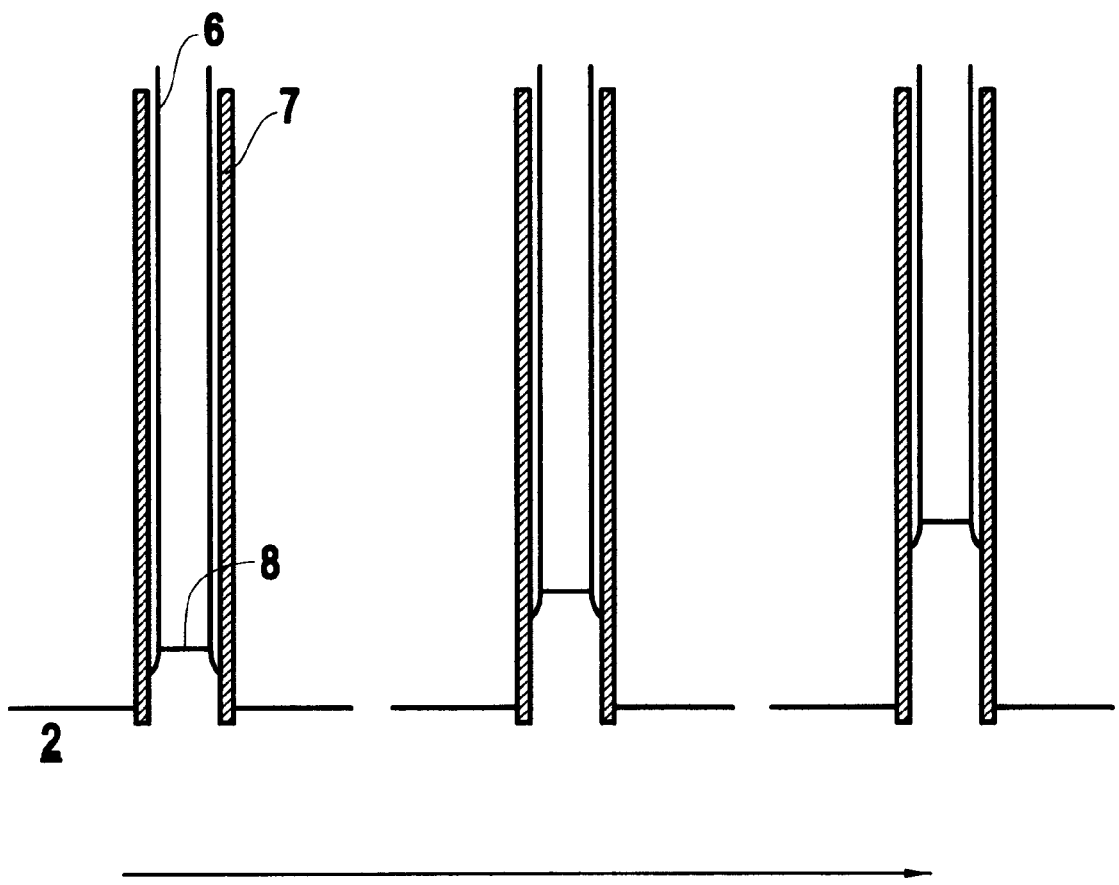
FIG. 3 is a diagram for illustrating the contact position between the electrode and the semiconductor melt in the case of growing a semiconductor single crystal by Czochralski method by using the first invention.

Initially, referring to FIG. 1, description will be given of a method that is based on the first invention where a current is passed between a growing semiconductor crystal and a semiconductor melt held in a magnetic field. In FIG. 1, peripheral devices such as a magnetic field applying device and a heater are omitted so as to make the essential parts easy to see. From a semiconductor melt (2) held in a crucible (1), a semiconductor single crystal (3) is pulled up through the medium of a seed crystal (5) which is set at the extremity of a pull shaft (4) made of electrically conductive material. The seed crystal and the pull shaft are coupled as in the ordinary crystal growing by Czochralski method, whereas the contact area between the seed crystal and the pull shaft is provided sufficiently large as to maintain favorable electric conductivity. An electrode (6) for passing a current between the growing semiconductor single crystal and the semiconductor melt in the crucible is made of the same material as the semiconductor single crystal to grow. Around this electrode is arranged a protective tube (7). The material of the protective tube is identical to that of the crucible. The electrode and the semiconductor melt inside the protective tube, as shown in FIG. 2, are put into contact (8) with each other at a position higher than the major surface of the semiconductor melt. Moreover, even when this contact portion (8) increases in temperature, the semiconductor melt rises inside the protective tube as shown in FIG. 3 so that the electrode and the melt are always in contact, never getting out of contact with each other.

Figure 4:
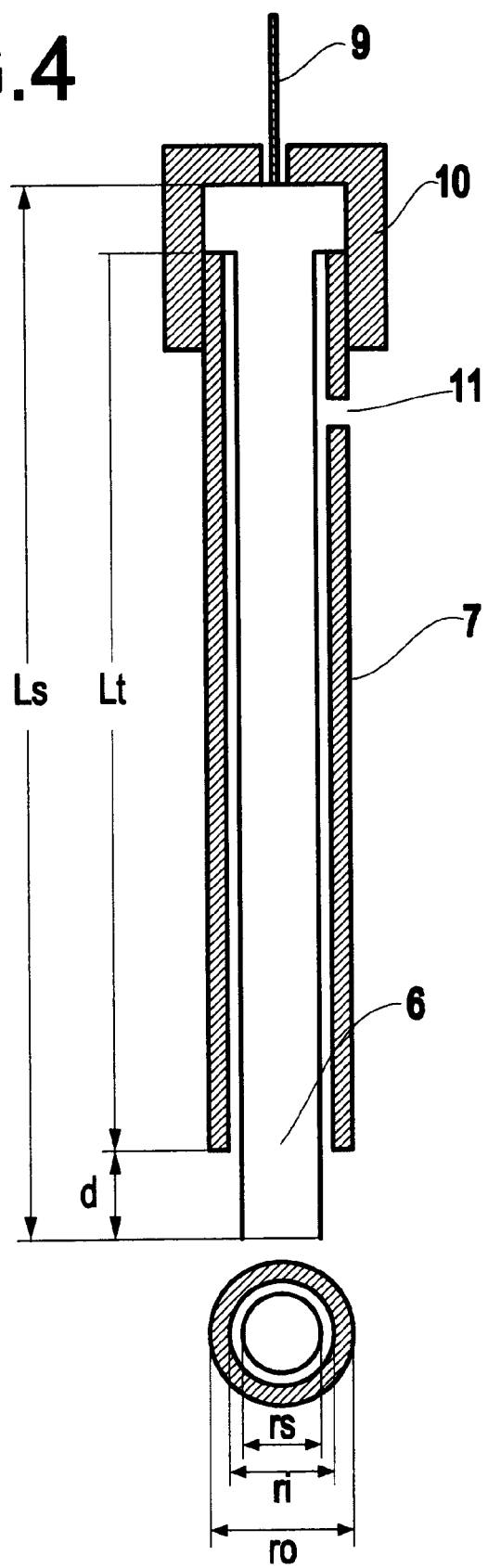
FIG. 4 is a diagram for illustrating the configurations of the electrode and the protective tube.

Moreover, in the semiconductor crystal growing apparatus of the present invention may also suitably employ the following configurations:

(1) A configuration as shown in FIG. 4, where one end of a tube that surrounds the electrode is opened so that the contact between the electrode and the melt come into contact with each other while the other end of the tube is provided with a mechanism for supporting the electrode and a mechanism for energizing the electrode. In FIG. 4, (9) represents a lead, and (10) a protective tube mounting jig.

(2) A configuration as shown in FIG. 4, where the inner diameter (ri) of the tube surrounding the electrode is greater than the diameter (rs) of the electrode.

(3) A configuration as shown in FIG. 4, where an air vent (11) is arranged in a part of the tube surrounding the electrode.

(4) A configuration where the electrode and the tube surrounding the electrode are arranged in a plurality of pairs.

(5) A configuration where the plurality of pairs in (4) are arranged symmetrically about the crystal pull shaft.

Furthermore, the semiconductor crystal growing method of the first invention may also suitably employ the following configurations:

(6) A configuration where the electrode is partly exposed from the opening of the tube surrounding the electrode before the electrode and the melt are put into contact.

(7) A configuration where the contact portion between the electrode and the melt, during the crystal growth, lies inner in the tube surrounding the electrode than the opening.

(8) A configuration where the position of the tube surrounding the electrode is controlled so that the opening of the tube always makes contact with the melt.

Figure 6:
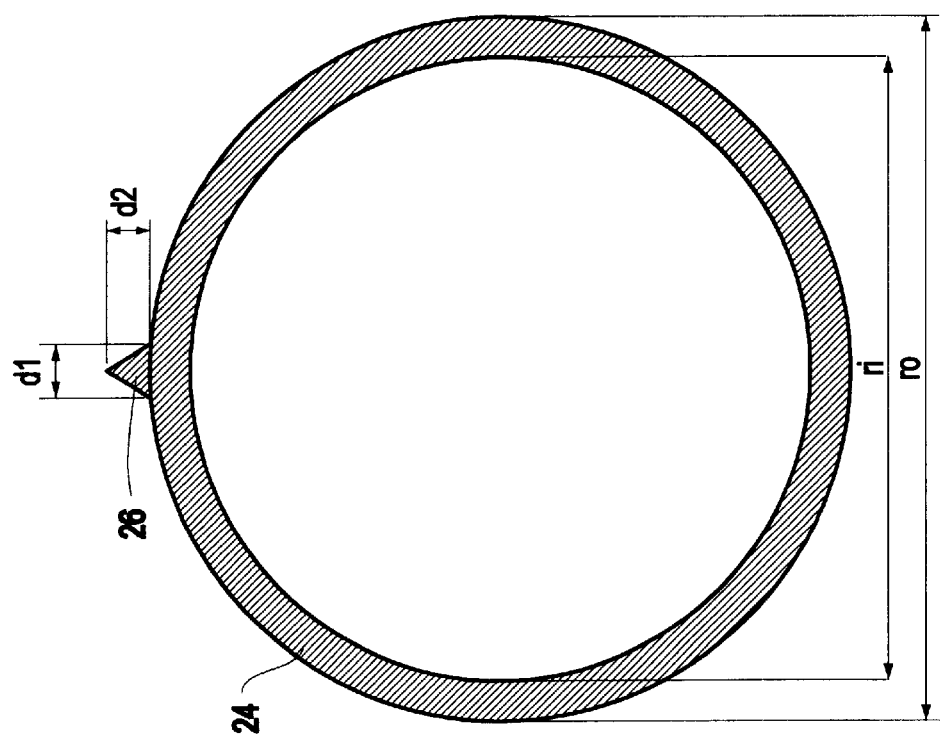
FIG. 6 is a diagram for illustrating the oonfiguration of a ring with a protrusion on its outer periphery, the ring for measuring the rotation rate of the semiconductor melt in the case of growing a semiconductor single crystal by Czochralskl method by using the second invention.
Figure 5:
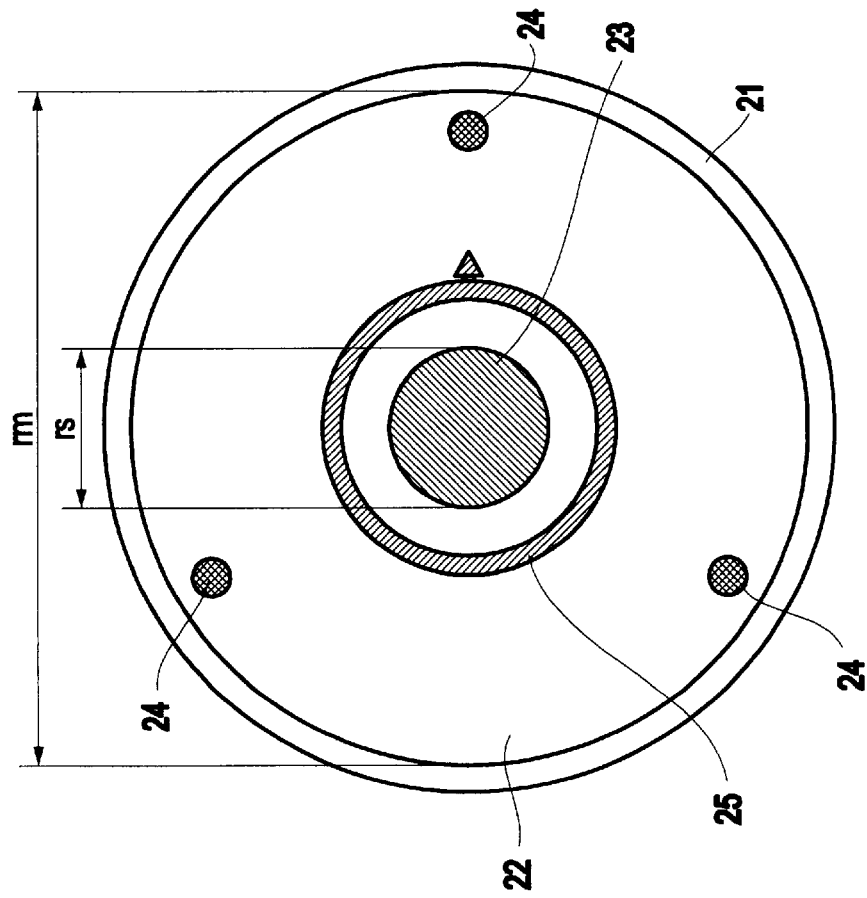
FIG. 5 is a diagram for illustrating the arrangement of a ring for measuring the rotation rate of the melt in the case of growing a semiconductor single crystal by Czochralski method by using the second invention.

Next, an embodiment of the second invention will be described. Referring to FIGS. 5 and 6, description will be given of the method for measuring the rotation rate of a rotating semiconductor melt when the semiconductor melt is rotated by passing a current between a growing semiconductor single crystal and the semiconductor melt held in a magnetic field. In FIG. 5, peripheral devices of the crystal growing furnace, such as a magnetic field applying device and a heater, are omitted so as to make the essential parts easy to see. A semiconductor single crystal (23) is pulled up from a semiconductor melt (22) held in a crucible (21). An electrode (24) for passing a current between the growing semiconductor single crystal and the semiconductor melt in the crucible is made of the same material as the semiconductor single crystal to grow.

A measurement ring (25) having an inner diameter greater than the diameter of the growing semiconductor single crystal is floated on the surface of the semiconductor melt. The measurement ring is formed of the same material as that of the crucible (21). This measurement ring has in a single position on its ring periphery a protrusion (26), a recess (27), a hole (28) piercing through the ring, or a deformed portion (29) on the top surface of the ring: while the ring is rotating, the time for the above-mentioned protrusion, recess, hole, or deformed portion to make one revolution is measured from exterior above the crystal growing furnace to determine the rotation rate of the melt. The configurations of the measurement rings and the protrusion, recess, hole, and deformed portion are shown in FIGS. 6, 7, 8, and 9, respectively.

The inner diameter (ri) and outer diameter (ro) of a measurement ring suitably satisfy the relations $$1.3 \times rs < ri < 1.5 \times rs$$

$$1 \times ri < ro < 1.25 \times ri$$

with respect to the diameter (rs) of the crystal to grow, and the thickness (t) of the ring does the relation $$0.025 \times ri < t < 0.125 \times ri.$$

Figure 8:
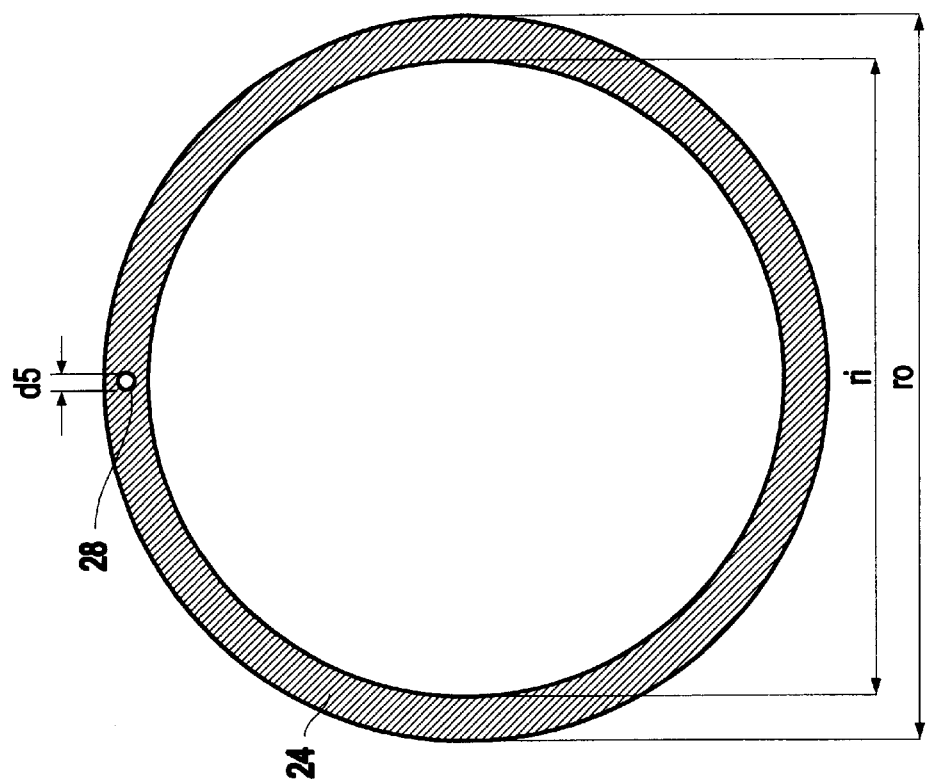
FIG. 8 is a diagram for illustrating the configuration of a ring with a piercing hole, the ring for measuring the rotation rate of the semiconductor melt in the case of growing a semiconductor single crystal by Czochralski method by using the second invention.
Figure 7:
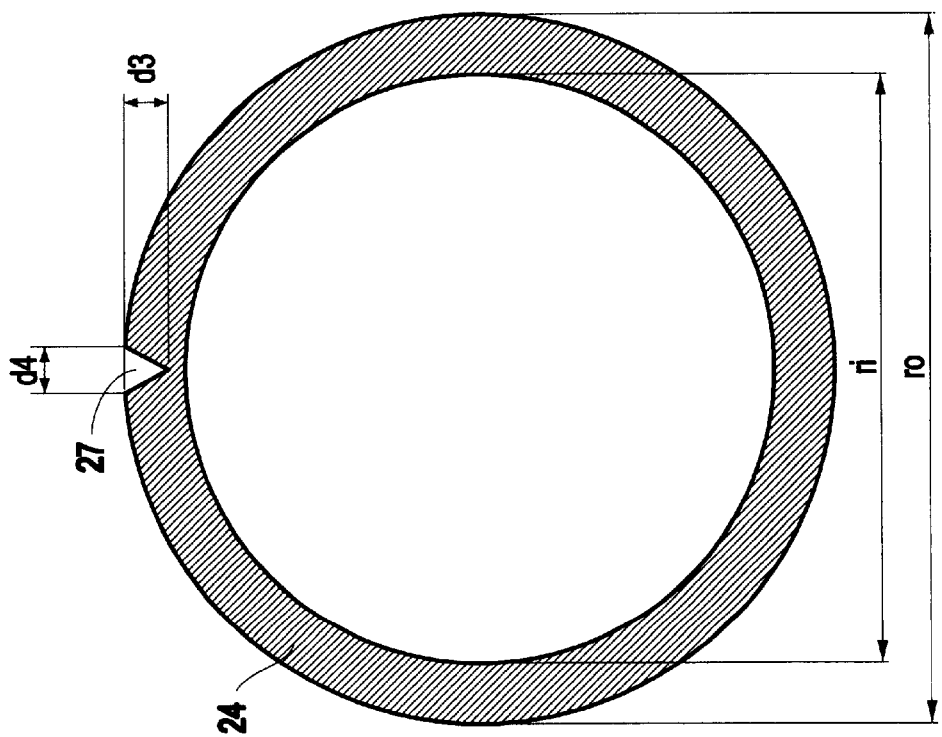
FIG. 7 is a diagram for illustrating the configuration of a ring with a recess in its outer periphery, the ring for measuring the rotation rate of the semiconductor melt in the case of growing a semiconductor single crystal by Czochralskli method by using the second invention.

The configuration of the protrusion (26) shown in FIG. 6 suitably satisfies the relations $$d1=d2$$

$$0.025 \times ri < d1 < 0.125 \times ri,$$

the recess (27) shown in FIG. 7 does the relations $$d3=d4$$

$$0.025 \times ri < d3 < 0.125 \times ri,$$

and the diameter of the hole (28) shown in FIG. 8 does the relation $$0.3 \times (ro-ri)/2 < d5 < 0.9 \times (ro-ri)/2.$$

Figures 9A, 9B:
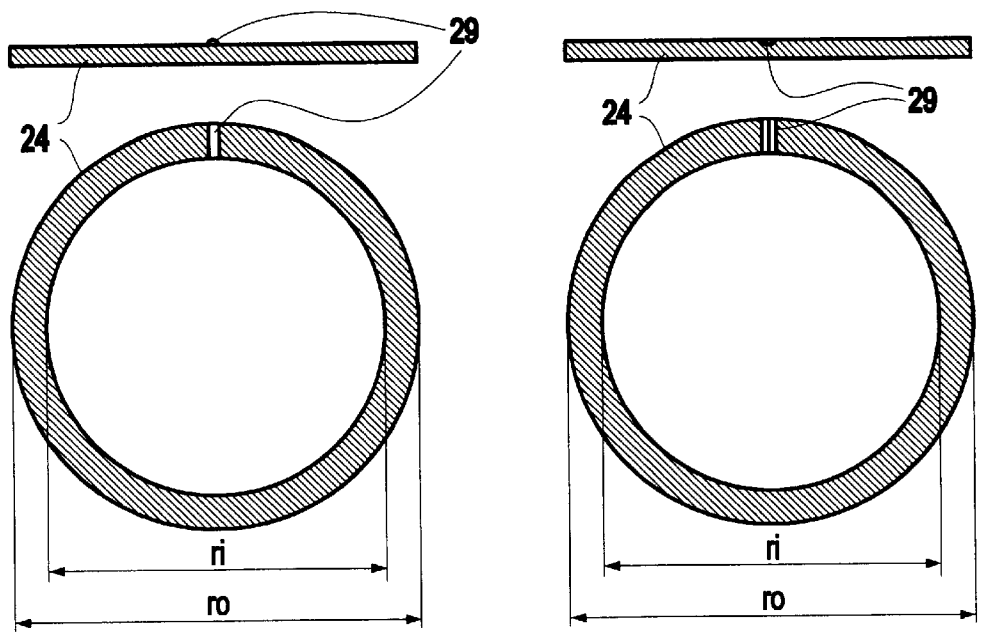
FIGS. 9a–9b is a diagram for illustrating the configurations of rings with deformed portions formed on the ring tops, the rings for measuring the rotation rate of the semiconductor melt in the case of growing a semiconductor single crystal by Czochralski method by using the second invention.

Moreover, the deformed portions on the ring top shown in FIG. 9 include the one partly projected linearly from the entire ring as shown in FIG. 9(a) and the one partly grooved as shown in FIG. 9(b).

crystal pull length or the crystal pull time. Here, the magnetic field signal parameter to modify suitably is the magnetic field strength, and the current signal parameter to modify is the current.

Embodiments

Embodiments of the first, second, and third inventions will be described hereinafter. Embodiments 1–13 are the embodiments of the first Invention, embodiments 14–25 are the embodiments of the second invention, embodiments 26–71 are the embodiments of the third invention, comparative e examples 1–11 are the comparative examples of the first invention, and comparative examples 12–41 are the comparative examples of the third invention.

In a quartz crucible of 7.5 cm in diameter was made 0.3 kg of silicon melt. In addition, as shown in FIG. 4, electrode rods (6) made of silicon, having a diameter (rs) of 0.2 cm and a length (Ls) of 8 cm, were inserted into quartz protective tubes (7) having an inner diameter (ri) of 0.25 cm, an outer diameter (ro) of 0.3 cm and a length (Lt) of 6 cm so that the silicon electrodes were extended 1 cm (d) out of the extremities of the protective tubes. With the quartz protective tubes immersed 0.1 cm or so into the surface of the silicon melt, silicon single crystal of 3 cm in diameter was grown. Here, boron was added to the melt so that the grown silicon single crystals were of p type and had a resistivity of 10 Ωcm. The electrodes were inserted to 0.5 cm, 1 cm, and 1.5 cm inside the orucible's inner wall. During crystal growth, the energization between the electrodes and the melt was always monitored with an ammeter. The contact positions between the electrodes and the melt were continuously observed from a side of the furnace by using radioscopy. After the crystal growth, the radial distributions of the dopant impurity concentrations in the crystals were determined by a spreading resistance method (SR method). Additionally, the radial distributions of the oxygen concentrations in the crystals were determined by scanning infrared spectroscopy (FT-IR method).

Table 1 collectively shows the conditions for the crystal growth, including the intensities of the magnetic field and current impressed, and the results of the crystal growth in the embodiments 1 through 3. Here, the radial distributions of the dopant concentration and the oxygen concentration were expressed by the following expression:

[(concentration at crystal center—concentration on crystal end)/ concentration at crystal center]×100.

TABLE 1

Crystal Growth Conditions and Resulting Crystals Grown in Embodiments 1–3

| | Electrode Position (cm) | Magnetic Field Strength (T) | Current (A) | Crystal Rotation Rate (rpm) | Electrode/ Melt Contact Status | Dopant Conc. Distribution (%) | Oxygen Conc. Distribution (%) |
|---|---|---|---|---|---|---|---|
| Emodiment 1 | 0.5 | 0.01 to 0.5 | 0.01 to 10 | 1 to 10 | Always in Contact | 0.5 | 0.6 |
| Embodinent 2 | 1 | 0.01 to 0.5 | 0.01 to 10 | 1 to 10 | Always in Contact | 0.5 | 0.6 |
| Embodiment 3 | 1.5 | 0.01 to 0.5 | 0.01 to 10 | 1 to 10 | Always in Contact | 0.5 | 0.6 |

As described above, in the third invention, the impressed magnetic field and/or the impressed current are/is suitably modified during the crystal growth, in accordance with the In a quartz crucible of 70 cm in diameter was made 300 kg of silicon melt. Besides, silicon single crystal electrodes of rs=1.0 cm and Ls=25 cm, having the same composition as that of the silicon single crystals to grow, were inserted into quartz protective tubes of ri=2.0 cm, ro=3.0 cm, and Lt=20 cm so that the silicon electrodes were longer by d=1 cm. With the quartz protective tubes immersed 2 mm or so into the surface of the silicon melt, silicon single crystal of 10 Ωm in resistivity and 30 cm in diameter was grown. The electrodes were inserted 1 cm, 5 cm, 10 cm, and 15 cm inside the crucible's inner wall. Three pairs of electrodes and protective tubes were arranged at such angles and positions that they fall symmetric about the crystal pull axis. Table 2 collectively shows the conditions for the crystal growth, including the intensities of the magnetic field and current impressed, and the results of the crystal growth.

It is found from the above embodiments that according to the present invention. the electrode(s) and the silicon melt never get out of contact with each other during crystal growth so that a current can be always applied while silicon single crystals are grown. In addition, it can be seen that the oxygen concentration distributions and the dopant impurity concentration distributions in the silicon single crystals grown according to the present invention fall at or below 1% in radial unevenness, and that the temperature distribution in the melt rotates in perfect agreement with the pull axis of the crystal.

TABLE 2

Crystal Growth Conditions and Resulting Crystals Grown in Embodiments 4–7

|  | Electrode Position (cm) | Magnetic Field Strength (T) | Current (A) | Crystal Rotation Rate (rpm) | Electrode/ Melt Contact Status | Dopant Conc. Distribution (%) | Oxygen Conc. Distribution (%) |
|---|---|---|---|---|---|---|---|
| Embodiment 4 | 1 | 0.01 to 0.5 | 0.01 to 10 | 1 to 10 | Always in Contact | 0.5 | 0.5 |
| Embodinent 5 | 5 | 0.01 to 0.5 | 0.01 to 10 | 1 to 10 | Always in Contact | 0.5 | 0.5 |
| Embodiment 6 | 10 | 0.01 to 0.5 | 0.01 to 10 | 1 to 10 | Always in Contact | 0.5 | 0.5 |
| Embodiment 7 | 15 | 0.01 to 0.5 | 0.01 to 10 | 1 to 10 | Always in Contact | 0.5 | 0.5 |

In the embodiments 8 through 11, a quartz crucible of 100 cm in diameter was used to grow silicon single crystals of 10 Ωcm in resistivity and 40 cm in diameter. In this case, silicon electrodes of rs=1.0 cm and Ls=30 cm were inserted into quartz protective tubes of ri=2.0 cm, ro=3.0 cm, and Lt=25 cm so that d=1 cm The quartz protective tubes were immersed 0.2 cm or so into the surface of the silicon melt for growth. In these embodiments, the electrodes were also put 1 cm, 5 cm, 10 cm, and 15 cm inside the crucible's inner wall. Three pairs of electrodes and protective tubes were arranged at such angles and positions that they fall symmetric about the crystal pull axis. Table 3 collectively shows the conditions for the crystal growth, including the intensities of the magnetic field and current impressed, and the results of the crystal growth.

For the sake of comparisons with the above-described embodiments 1–11, no protective tubes but silicon electrodes alone were used to grow silicon single crystals of 0.001 Ωcm in resistivity and 3.0 cm, 30.0 cm, or 40.0 cm in diameter. Table 4 provides a summary of the electrode-melt contact conditions and the results of the dopant Impurity concentration distributions and the oxygen concentration distributions in the grown crystals. The crystal growth conditions not shown in the table, including the arrangement of the electrodes, were the same as those of the embodiments 1–11 (comparative examples 1–11. designated by the same numbers as those of the corresponding the embodiments. respectively).

TABLE 3

Crystal Growth Conditions and Resulting Crystals Grown in Embodiments 8–11

|  | Electrode Position (cm) | Magnetic Field Strength (T) | Current (A) | Crystal Rotation Rate (rpm) | Electrode/ Melt Contact Status | Dopant Conc. Distribution (%) | Oxygen Conc. Distribution (%) |
|---|---|---|---|---|---|---|---|
| Embodiment 8 | 1 | 0.01 to 0.5 | 0.01 to 10 | 1 to 10 | Always in Contact | 0.5 | 0.5 |
| Embodiment 9 | 5 | 0.01 to 0.05 | 0.01 to 10 | 1 to 10 | Always in Contact | 0.5 | 0.5 |
| Embodiment 10 | 10 | 0.01 to 0.5 | 0.01 to 10 | 1 to 10 | Always in Contact | 0.5 | 0.5 |
| Embodiment 11 | 15 | 0.01 to 0.5 | 0.01 to 10 | 1 to 10 | Always in Contact | 0.5 | 0.5 |

TABLE 4

Crystal Growth Conditions and Resulting Crystals Grown in Comparative Examples

| | Crystal Diameter (cm) | Crucible Diameter (cm) | Electrode Position (cm) | Electode/Melt Contact Status | Dopant Conc. Distribution (%) | Oxygen Conc. Distribution (%) |
|---|---|---|---|---|---|---|
| Comp. Example 1 | 3.0 | 7.5 | 0.5 | Come Off in Creating Tail | 5.0 | 5.0 |
| Comp. Example 2 | 3.0 | 7.5 | 1.0 | Come Off in Creating Tail | 5.0 | 5.0 |
| Comp. Example 3 | 3.0 | 7.5 | 1.5 | Come Off in Creating Tail | 5.0 | 5.0 |
| Comp. Example 4 | 30.0 | 75.0 | 1 | Come Off at Shoulder | 10.0 | 10.0 |
| Comp. Example 5 | 30.0 | 75.0 | 5 | Come Off at Shoulder | 10.0 | 10.0 |
| Comp. Example 6 | 30.0 | 75.0 | 10 | Come Off at Tail | 10.0 | 10.0 |
| Comp. Example 7 | 30.0 | 75.0 | 15 | Come Off at Tail | 10.0 | 10.0 |
| Comp. Example 8 | 40.0 | 75.0 | 1 | Come Off at Shoulder | 10.0 | 10.0 |
| Comp. Example 9 | 40.0 | 75.0 | 5 | Come Off at Shoulder | 10.0 | 10.0 |
| Comp. Example 10 | 40.0 | 75.0 | 10 | Come Off at Shoulder | 10.0 | 10.0 |
| Comp. Example 10 | 40.0 | 75.0 | 15 | Come Off at Tail | 10.0 | 10.0 |

The results of these comparative examples show that when no protective tube is arranged around each electrode, the electrode and the melt get out of contact with each other during crystal growth, making it difficult to always apply a current to grow a silicon single crystal. It can also be seen that when there is no protective tube, the melt directly below each electrode is pulled up, whereby the surface of the melt between the electrode and the crystal deforms to deteriorate the axial symmetry in temperature distribution. The radial oxygen concentration and dopant impurity concentration distribution in the crystal thus fall at or above 1% in unevenness, so that the oxygen concentration and the dopant impurity concentration distribution are hard to uniformize.

In order to confirm the applicability of the present invention to the growth of semiconductor crystals other than silicon, a 15-cm-diameter GaAs single crystal was grown as the embodiment 12, in a p-BN (Pyrolytic-Boron Nitride) crucible of 30 cm in diameter by using GaAs single crystals having the composition identical to that of the to-grow GaAs single crystal as electrodes under the electrode arrangement identical to that of the embodiment 5. In this case, the same p-BN as that used for the crucible was used as the material of the electrode protective tubes. The protective tubes were also identical to those of the embodiment 5 in size. In the crystal growth, an appropriate amount of silicon was added as a dopant so that the resistivity falls at 10 Ωcm.

Moreover, for the embodiment 13, an InP single crystal of 10 cm in diameter was grown from a p-BN crucible of 20 cm in diameter by using InP single crystals having the composition identical to that of the to-grow InP single crystal as electrodes. Again, the material of the electrode protective tubes was grown from a p-BN crucible made of the same material as the crucible. Again, the same p-BN as that used for the melting port was used as the material of the electrode protective tubes, to perform crystal growth with the same size and arrangement as those of the embodiment 5. In the crystal growth, an appropriate amount of antimony was added as a dopant so that the crystal has a resistivity of 10 Ωcm.

TABLE 5

Crystal Growth Conditions and Resulting Crystals Grown in Embodiments 12, 13

| | Crystal Type | Crystal/Crucible Diameter (cm) | Electrode Material | Protective Tube Material | Electrode/Melt Contact Status | Dopant Concentration Distribution (%) |
|---|---|---|---|---|---|---|
| Ex. 12 | GaAs | 15.0/30.0 | GaAs Single Crystal | p-BN | Always in Contact | 0.5 |
| Ex. 13 | InP | 15.0/30.0 | InP Single Crystal | p-BN | Always in Contact | 0.5 |

These results show that even when non-silicon semiconductor crystal is grown, the first invention can prevent the electrode(s) and the semiconductor melt from getting out of contact with each other, so that the semiconductor single crystal can be grown with a current applied continuously. Besides, it is confirmed that a semiconductor crystal as uniform as 1% or less in the radial distribution of dopant concentration can be grown.

The first invention is not limited to the above-mentioned embodiments in electrode arrangement and structure. It covers all apparatuses and methods In which electrodes are used with protective tubes arranged around the same. It is also clear from the consideration of the principles that the present invention is a technology effective for the growth of material crystals other than semiconductors.

Next, the embodiments of the second invention will be described with reference to the drawings. Hereinafter, description will be given of the method according to the second invention, of growing a crystal while monitoring the rotation rate of the semiconductor melt which is rotated under electromagnetic forces.

rotation rate of the silicon melt can be measured accurately by the method of using a ring according to the present the embodiments.

Moreover, these measurements of the rotation rate were used to set the rotation rate of the melt so that the oxygen concentrations in crystals were changed. From FIG. 10, It can be seen that under an applied magnetic field of 0.05 T, the silicon melt rotates at rates of 10 rpm, 50 rpm. and 100 rpm when currents of 0.2 A, 0.9 A, and 2.2 A are passed. With the applied magnetic field strength and current set at these values. silicon single crystals were grown while the rotation rate is monitored with the measurement ring. Here, an appropriate amount of boron was added to grow crystals of p type and of 10 Ωcm in resistivity. The silicon single crystals grown were measured for the concentrations of oxygen, boron, and other impurities therein. Table 6 shows the measurements of the concentrations of oxygen, boron, and other impurities in the silicon single crystals grown.

TABLE 6

Crystal Growth Conditions, Magnetic Field Strength, and Current in Embodiments 14–16

| | Magnetic Field Strength (T) | Current (A) | Melt Rotation Rate (rpm) | Boron Conc. ($cm^{-2}$) | Oxygen Conc. ($cm^{-2}$) | Other Impurities ($cm^{-2}$) |
|---|---|---|---|---|---|---|
| Embodiment 14 | 0.05 | 0.2 | 10 | $1.5 \times 10^{15}$ | $1.0 \times 10^{17}$ | Not Detected |
| Embodiment 15 | 0.05 | 0.9 | 50 | $1.5 \times 10^{15}$ | $1.0 \times 10^{17}$ | Not Detected |
| Embodiment 16 | 0.05 | 2.2 | 100 | $1.5 \times 10^{15}$ | $1.0 \times 10^{17}$ | Not Detected |

The embodiments 14 through 17 will deal with the cases of growing a silicon single crystal by the method according to the second invention In the cases of silicon single crystals, the ring was made of quartz which is the same as the material of the crucible. This ring was used to grow a silicon single crystal of 3.0 cm in diameter from the quartz crucible of 7.5 cm in diameter. On crystal growth, a 0.4-cm-diameter electrode rod made of silicon was put into contact with a silicon melt and arranged at a position 1 cm inside the crucible's inner wall. For a start, under magnetic field strengths of 0.01 T, 0.03 T, 0.05 T, and 0.1 T, the rotation rate of the silicon melt was measured with the applied current continuously changed from 0 to 8 A.

Figure 10:
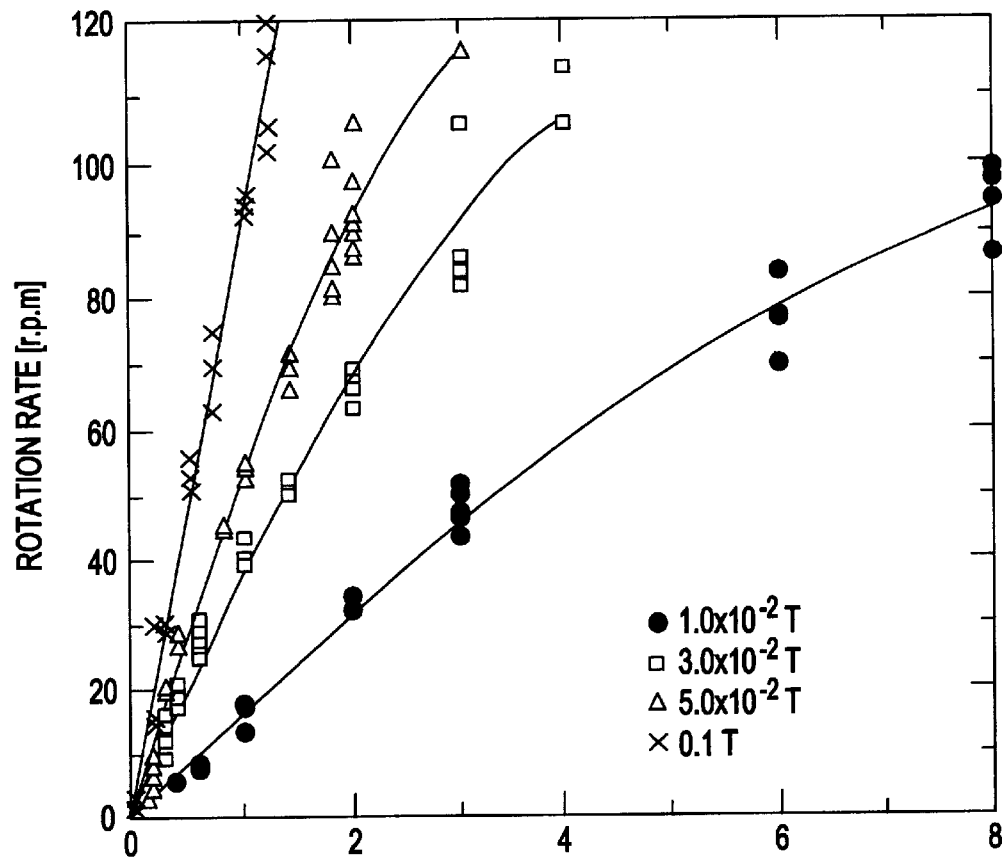
FIG. 10 is a diagram for illustrating the measurements of the rotation rate of the semiconductor melt in the case of growing a semiconductor single crystal by Czochralski method by using the second invention.

FIG. 10 shows the measurements of the ring's rotation rate obtained from above the furnace. For each applied magnetic field strength, the rotation rate of the silicon melt measured from the ring rotation is plotted on the ordinate with the current on the abscissa. This confirms that the These measurements show that the rotation rate of a silicon melt can be set at an arbitrary value to set the oxygen concentration within a single-digit range. Here, it can also be confirmed that the dopant impurity concentration is determined by the amount mixed initially and does not depend on the rotation rate. Furthermore, it is shown that floating the measurement ring caused no impurities other than oxygen and the dopant, boron, to mix in and that even the method of the present invention can prevent unnecessary impurities from mixing in.

Next, the effects of the second invention for the case of greater crystal diameters will be described in the form of the embodiments. For the embodiments 17, 18, and 19, silicon single crystals of 30 cm in crystal diameter were grown while measurement rings made of quartz were used to measure the rotation rate of the silicon melt. Table 7 provides a summary of the configurations of the measurement rings.

TABLE 7

Dimensions of Measurement Rings in Growing 30-cm-Diameter Silicon Single Crystals

| | Crystal Diameter (rs, cm) | Ring Inner Diameter (ri, cm) | Ring Outer Diameter (ro, cm) | Ring Thickness (t, cm) | Protrusion (d1, d2, cm) | Recess (d3, d4, cm) |
|---|---|---|---|---|---|---|
| With Protrusion | 30 | 39 | 46 | 0.5 | 1 | — |
| With Recess | 30 | 39 | 46 | 0.8 | — | 1 |

For the embodiments 17–19, silicon single crystals of p type, having a resistivity of 10 Ωcm were grown under a magnetic field of 0.1 T. with a current changed to set the rotation rate at 10 rpm, 50 rpm, and 100 rpm. Table 8 shows the magnetic field strength and current applied, the measured rotation rate of the melt, and the measurements of the oxygen concentration and boron concentration in the crystals grown.

TABLE 8

Crystal Growth Conditions, Magnetic Field Strength, and Current in Embodiments 17–19

| | Magnetic Field Strength (T) | Current (A) | Melt Rotation Rate (rpm) | Boron Conc. ($cm^{-2}$) | Oxygen Conc. ($cm^{-2}$) |
|---|---|---|---|---|---|
| Embodiment 17 | 0.1 | 0.2 | 20 | $1.5 \times 10^{15}$ | $0.8 \times 10^{17}$ |
| Embodiment 18 | 0.1 | 1.2 | 60 | $1.5 \times 10^{15}$ | $3.0 \times 10^{17}$ |
| Embodiment 19 | 0.1 | 2.5 | 120 | $1.5 \times 10^{15}$ | $8.0 \times 10^{17}$ |

Moreover, for the embodiments 20, 21, and 22, silicon single crystals of 40 cm in crystal diameter, of p type, and of 10 Ωcm in resistivity were grown while measurement rings made of quartz were used to measure the rotation rates of the silicon melts. Table 9 provides a summary of the configurations of the measurement rings.

TABLE 9

Dimensions of Measurement Rings in Growing 40-cm-Diameter Silicon Single Crystals

| | Crystal Diameter (rs, cm) | Ring Inner Diameter (ri, cm) | Ring Outer Diameter (ro, cm) | Ring Thickness (t, cm) | Protrusion (d1, d2, cm) | Recess (d3, d4, cm) |
|---|---|---|---|---|---|---|
| With Protrusion | 40 | 54 | 60 | 1.4 | 1.5 | — |
| With Recess | 40 | 54 | 60 | 1.4 | — | 1.5 |

The crystals were grown under a magnetic field of 0.15 T, with a current changed to set the rotation rate at 30 rpm, 80 rpm, and 150 rpm. Table 10 shows the magnetic field strength and current applied, the rotation rate of the melt, and the measurements of the oxygen concentration and boron concentration in the crystals grown.

TABLE 10

Crystal Growth Conditions, Magnetic Field Strength, and Current in Embodiments 20–22

| | Magnetic Field Strength (T) | Current (A) | Melt Rotation Rate (rpm) | Boron Conc. ($cm^{-2}$) | Oxygen Conc. ($cm^{-2}$) |
|---|---|---|---|---|---|
| Embodiment 20 | 0.15 | 3.0 | 30 | $1.5 \times 10^{15}$ | $0.8 \times 10^{17}$ |
| Embodiment 21 | 0.15 | 1.5 | 80 | $1.5 \times 10^{15}$ | $3.0 \times 10^{17}$ |
| Embodiment 22 | 0.15 | 3.0 | 150 | $1.5 \times 10^{15}$ | $8.0 \times 10^{17}$ |

From the above embodiments 14 through 22, it was confirmed that growing a silicon single crystal while monitoring the rotation rate of the silicon melt rotated under electromagnetic force by using a measurement ring according to the second invention makes it possible to grow a crystal of desired dopant concentration and oxygen concentration.

In order to confirm that the present invention is applicable to the growth of semiconductor single crystals other than silicon, a GaAs single crystal of 15 cm in diameter was grown as the embodiment 23, in a p-BN (Pyrolytic-Born Nitride) crucible of 30 cm in diameter. In this case, an appropriate amount of silicon was added as a dopant impurity so that the crystal has a resistivity of 10 Ωcm. For the embodiment 24, a GaIs single crystal of 10 cm in diameter was also grown in a p-BN crucible of 20 cm in diameter. Again, an appropriate amount of antimony was added as a dopant impurity to grow a crystal of 10 Ωcm in crystal resistivity. In both cases, the electrodes had the same arrangement and material as those described in Japanese Patent Application No.Hei 9-343261 and Japanese Patent Application No.Hei 10-065174. The measurement rings for measuring the rotation rate used the same p-BN as the crucible in the case of GaAs single crystals, and also used the same p-BN as the crucible in the case of InP single crystals. Table 11 provides a summary of the dimensions of the measurement rings for each case.

TABLE 11

Measurement Rings for Use in GaAs and InP Single Crystal Growth

|  | Crystal Diameter (rs, cm) | Ring Inner Diameter (ri, cm) | Ring Outer Diameter (ro, cm) | Ring Thickness (t, cm) | Protrusion (d1, d2, cm) | Recess (d3, d4, cm) |
|---|---|---|---|---|---|---|
| Embodiment 23 (Protrusion) | GaAs 15 | 20 | 22 | 0.5 | 0.8 | — |
| Embodiment 23 (Recess) | GaAs 15 | 20 | 22 | 0.5 | — | 0.8 |
| Embodiment 24 (Protrusion) | InP 10 | 14 | 16 | 0.4 | 0.5 | — |
| Embodiment 24 (Recess) | InP 10 | 14 | 16 | 0.4 | — | 0.5 |

In the embodiment 23, the crystals were grown under a magnetic field of 0.1 T. with a current changed to set the rotation rate at 30 rpm. In the embodiment 24, the crystals were grown under a magnetic field of 0.1 T, with a current changed to set the rotation rate of the melt at 20 rpm. Table 12 shows the magnetic fields and currents applied, the rotation rates of the melts measured, and the measurements of the dopant impurity concentration in the crystals grown.

TABLE 12

GaAs and InP Single Crystal Growth Conditions in Embodiments 23, 24

|  | Crystal | Magnetic Field Strength (T) | Current (A) | Melt Rotation Rate | Dopant Impurity Conc. ($cm^{-2}$) |
|---|---|---|---|---|---|
| Embodiment 23 | GaAs | 0.1 | 0.3 | 30 | Si $1.5 \times 10^{15}$ |
| Embodiment 24 | InP | 0.1 | 0.25 | 20 | Sb $1.5 \times 10^{15}$ |

These results show that even when non-silicon semiconductor single crystals are grown, the second invention allows crystal growth at desired rotation rates and makes it possible to grow semiconductor single crystals containing no impurities other than their dopant impurities.

The second invention is not limited to the above embodiments in the size and structure of the measurement ring. It covers all semiconductor single crystal growing apparatuses and growing methods in which a measurement ring made of the same material as that of the crucible is floated on the surface of the semiconductor melt. It is also clear from the consideration of the principles that the present invention is a technology effective for the growth of material crystals other than semiconductors.

Next, the embodiments of the third invention will be described with reference to the drawings. For the embodiments 25–46, in order to verify that the third invention uniformly distributes impurities in a semiconductor crystal along the crystal-pulling direction, 0.3 kg of silicon melt was made in a quartz crucible of 7.5 cm in diameter. From this, silicon single crystals of 4.0 cm in diameter were grown with boron (B) as the dopant impurity or with phosphorus (P) as the dopant impurity. Silicon single crystals were used as the electrodes for current application. Three electrodes were used and inserted at such angles that they fall symmetric about the crystal pull axis. Each of the electrodes was arranged at a position 0.7 cm inside the crucible's inner wall.

Figure 11A:
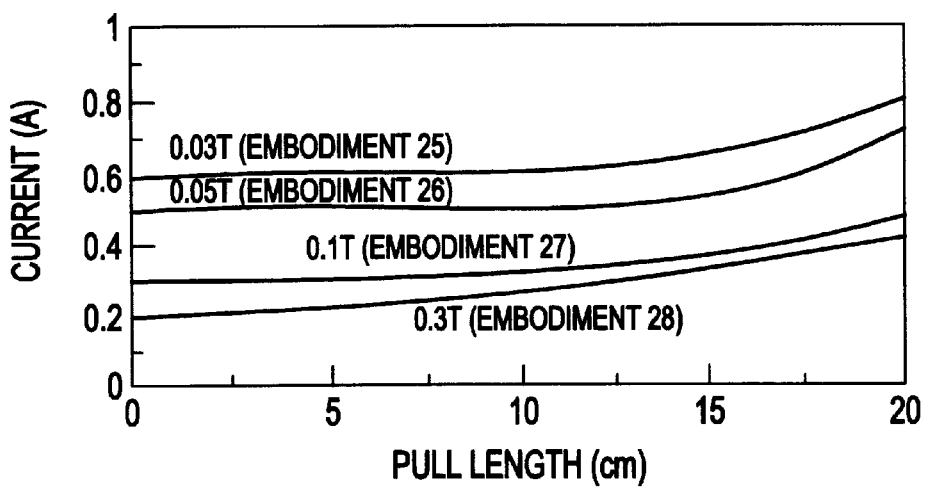
FIG. 11(a) is a graph showing the variations in applied current with respect to a change in crystal pull length. in embodiments 25–28 of a method according to the third invention.
Figure 11B:
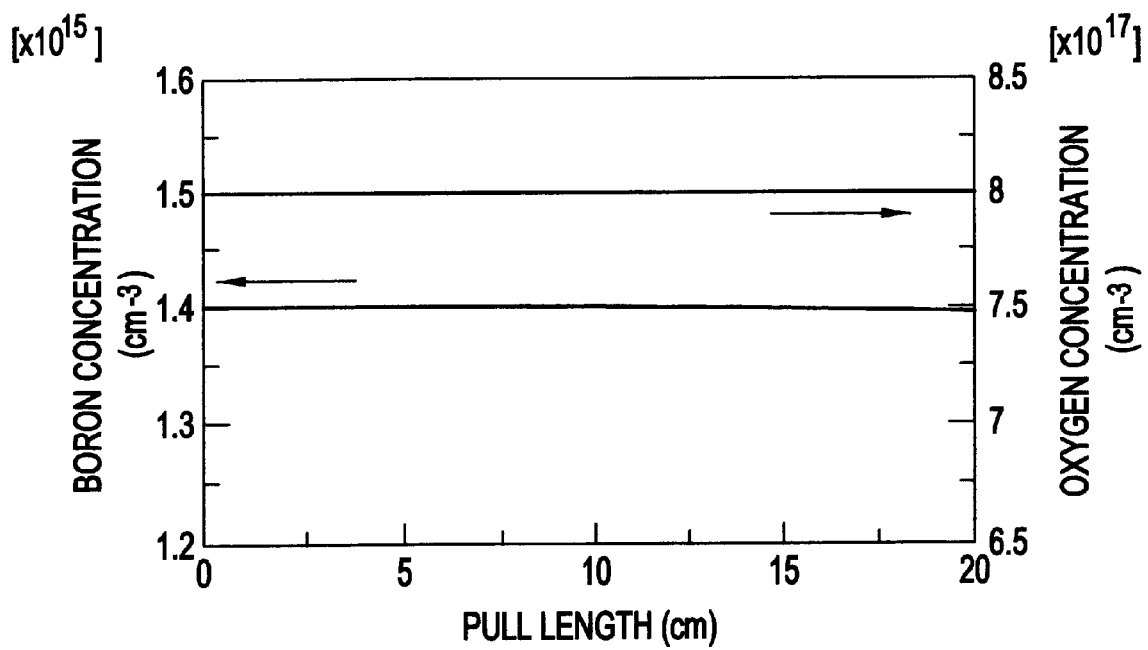
FIG. 11(b) is a graph showing the measurements of the boron and oxygen concentrations obtained along the crystal pull axes at the crystal centers of the grown silicon single crystals, in the embodiments 25–28 of the method according to the third invention.

In the case of boron doping, the crystal growth was conducted by the method of the following embodiments 25–35. The grown crystals were measured for boron and oxygen concentrations therein along the direction of crystal growth. In the embodiments 25–28, the applied magnetic field strength was fixed to 0.03 T, 0.05 T, 0.1 T, and 0.3 T while the current was changed with the crystal pull length. FIG. 11(a) shows variations in current here. Additionally, FIG. 11(b) shows the measurements of the boron and oxygen concentrations obtained at the centers of the grown crystals along the pull axis In FIGS. 11(a) and (b), the abscissas indicate the crystal pull length. Table 13 provides a summary of the crystal growth conditions and the variations in oxygen and boron concentrations.

TABLE 13

Magnetic Field Strength and Impurity Concentration Distribution in Embodiments 25–28

|  | Magnetic Field Strength (T) | Current (A) | Melt Rotation Rate (rpm) | Variation in Oxygen Conc. (%) | Variation in Boron Conc. (%) |
|---|---|---|---|---|---|
| Embodiment 25 | 0.03 | 0.6–0.8 | 18–28 | <1 | <1 |
| Embodiment 26 | 0.05 | 0.5–0.7 | 30–40 | <1 | <1 |
| Embodiment 27 | 0.1 | 0.3–0.48 | 35–40 | <1 | <1 |
| Embodiment 28 | 0.3 | 0.2–0.42 | 60–80 | <1 | <1 |

Figure 12A:
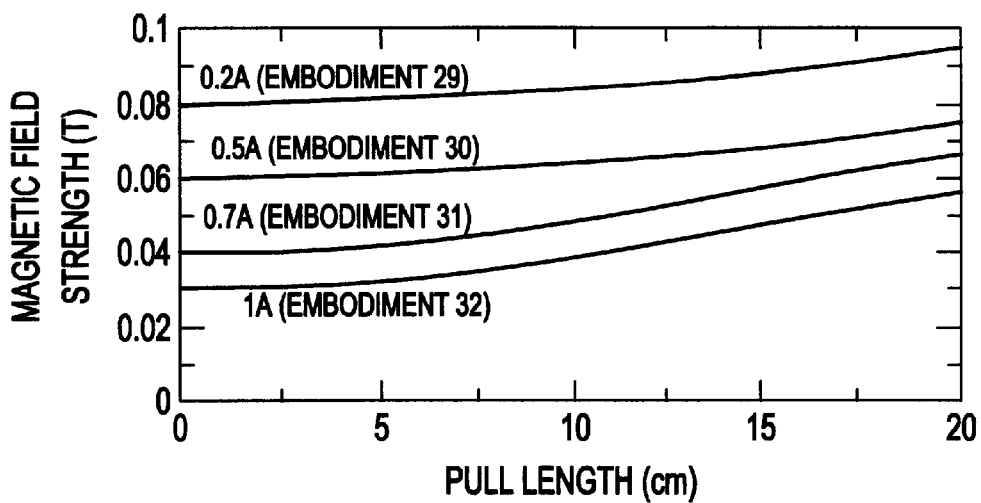
FIG. 12(a) is a graph showing the variations in applied magnetic field strength with respect to a change in crystal pull length, in embodiments 29–32 of the method according to the third invention.
Figure 12B:
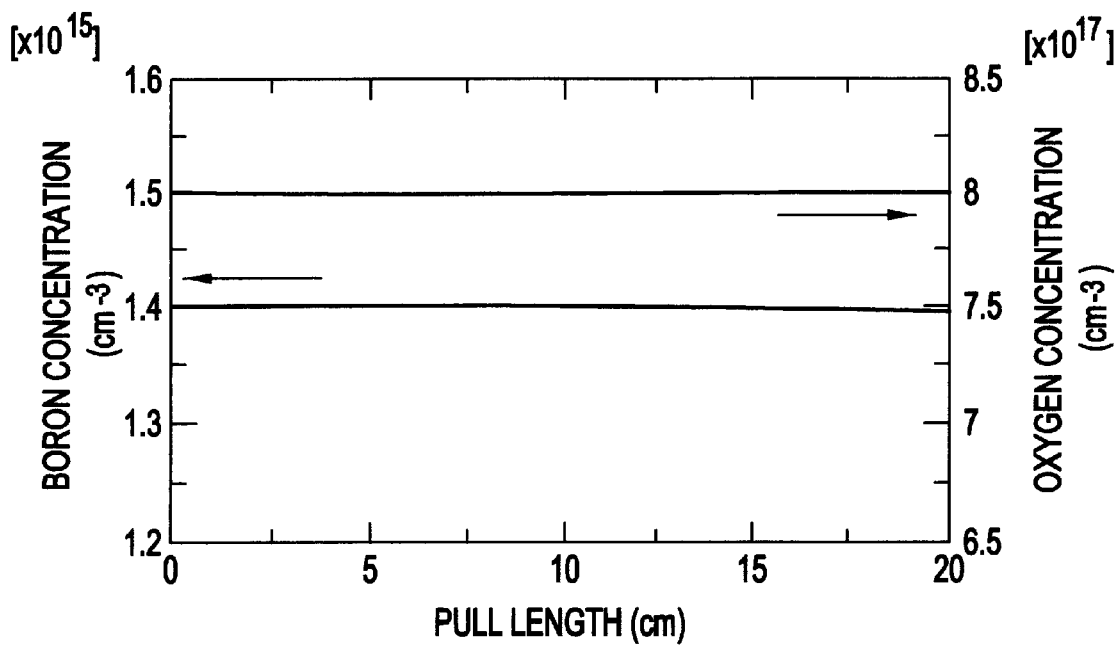
FIG. 12(b) is a graph showing the measurements of the boron and oxygen concentrations obtained along the crystal pull axes at the crystal centers of the grown silicon single crystals, in the embodiments 29–32 of the method according to the third invention.

For the embodiments 29–32, the current was fixed to 0.2 A, 0.5 A, 0.7 A, and 1.0A while the magnetic field strength was changed with the crystal pull length. FIG. 12(a) shows the magnetic field strength changed with the crystal pull length for each current. Then, FIG. 12(b) shows the concentrations of boron and oxygen measured at the centers of the grown crystals along the pull axis. In FIGS. 12(a) and (b), the abscissas indicate the crystal pull length. Table 14 provides a summary of the crystal growth conditions and the variations in oxygen and boron concentrations.

TABLE 14

Current and Impurity Concentration Distribution in Embodiments 29–32

|  | Current (A) | Magnetic Field Strength (T) | Melt Rotation Rate (rpm) | Variation in Oxygen Conc. (%) | Variation in Boron Conc. (%) |
|---|---|---|---|---|---|
| Embodiment 29 | 0.2 | 0.08–0.094 | 18–28 | <1 | <1 |
| Embodiment 30 | 0.5 | 0.06–0.075 | 30–40 | <1 | <1 |
| Embodiment 31 | 0.7 | 0.04–0.066 | 28–40 | <1 | <1 |
| Embodiment 32 | 1.0 | 0.03–0.056 | 30–60 | <1 | <1 |

Figure 13A:
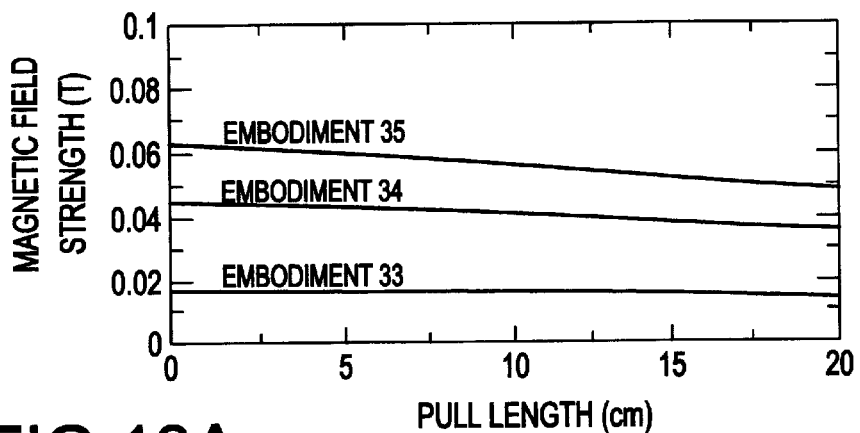
FIG. 13(a) is a graph showing the variations in applied magnetic field strength with respect to a change in crystal pull length, in embodiments 33–35 of the method according to the third invention.
Figure 13B:
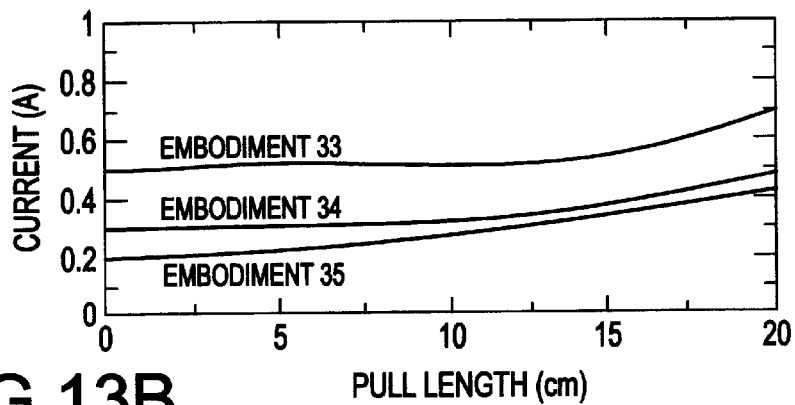
FIG. 13(b) is a graph showing the variations in applied current with respect a change in crystal pull length, in the embodiments 33–35 of the method according to the third invention.
Figure 13C:
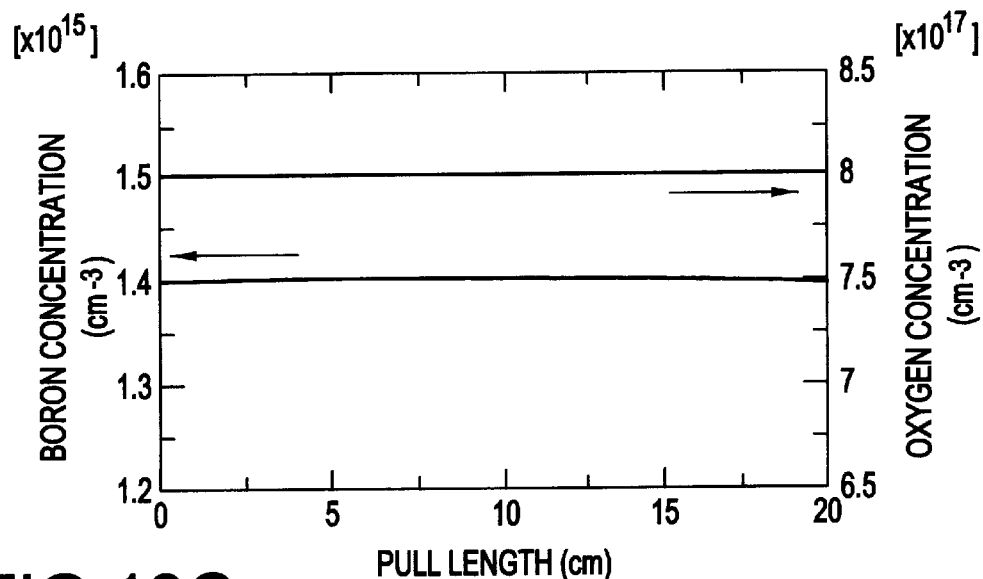
FIG. 13(c) is a graph showing the measurements of the boron and oxygen concentrations obtained along the crystal pull axes at the crystal centers of the grown silicon single crystals, in the embodiments 33–35 of the method according to the third invention.

For the embodiments 33–35, both the applied current and magnetic field strength were changed with the crystal pull length. FIG. 13(a) shows the applied magnetic field strengths which were changed with the pulling time. FIG. 13(b) shows variations in current. FIG. 13(c) shows the concentrations of boron and oxygen measured at the centers of the grown crystals along the pull axis. In FIGS. 13(a), (b), and (c), the abscissas indicate the crystal pull length. Table 15 provides a summary of the crystal growth conditions and the variations in oxygen and boron concentrations.

TABLE 15

Current, Magnetic Field Strength, and Impurity Concentration Distribution in Embodiments 23–35

|  | Magnetic Field Strength (T) | Current (A) | Melt Rotation Rate (rpm) | Variation in Oxygen Conc. (%) | Variation in Boron Conc. (%) |
|---|---|---|---|---|---|
| Embodiment 25 | 0.018–0.016 | 0.5–0.7 | 10–13 | <1 | <1 |
| Embodiment 26 | 0.045–0.038 | 0.3–0.48 | 15–18 | <1 | <1 |
| Embodiment 27 | 0.062–0.048 | 0.2–0.42 | 12–25 | <1 | <1 |

From the results of these the embodiments 25–35, it was confirmed that the method of the third invention allows the boron concentration and oxygen concentration in a silicon single crystal to have a uniform distribution with variations of not greater than 1% along the direction of growth.

Figure 14A:
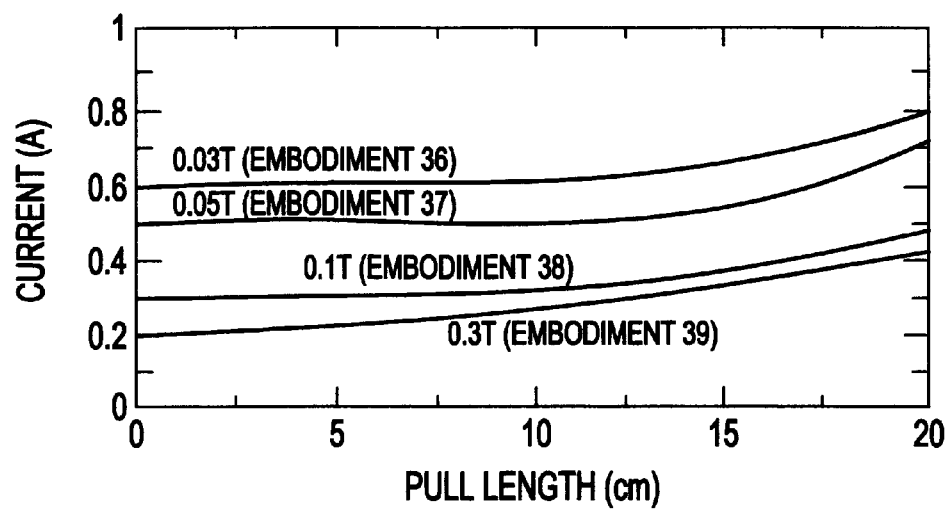
FIG. 14(a) is a graph showing the variations in applied current with respect to a change in crystal pull length, in embodiments 36–39 of the method according to the third invention.
Figure 14B:
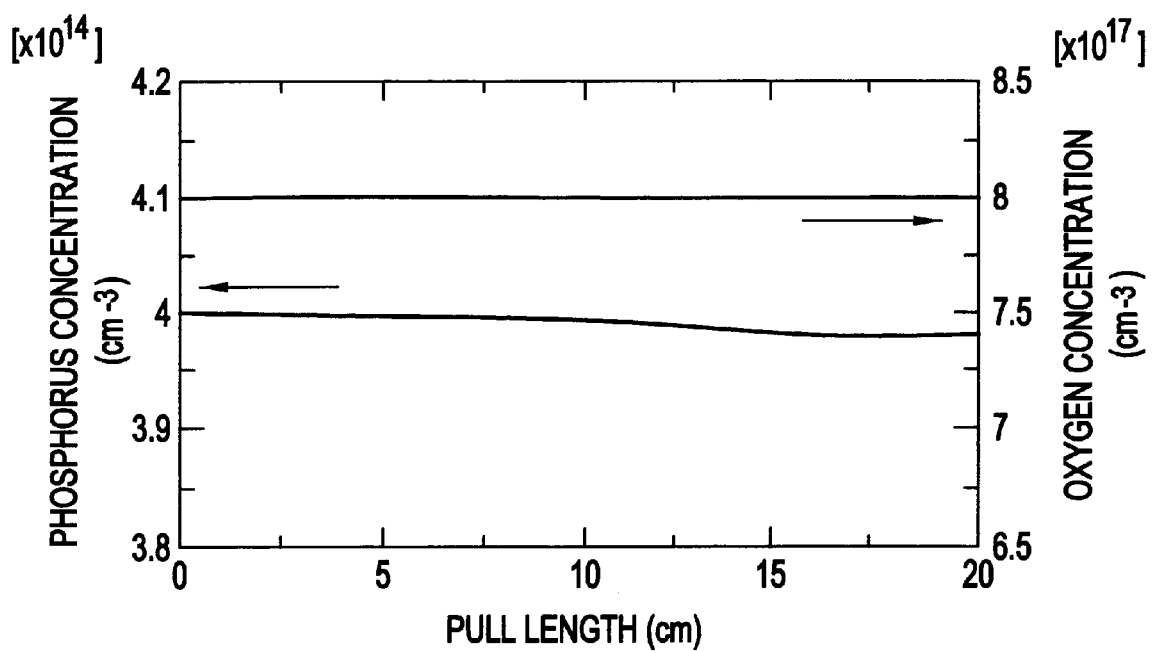
FIG. 14(b) is a graph showing the measurements of the phosphorus and oxygen concentrations obtained along the crystal pull axes at the crystal centers of the grown silicon single crystals, in the embodiments 36–39 of the method according to the third invention.

Next, the embodiments 36–46 will deal with the case of growing phosphorus-doped silicon single crystals. In the embodiments 36–39, the applied magnetic field strength was fixed to 0.03 T. 0.05 T, 0.1 T, and 0.3 T while the current was changed with the crystal pull time. FIG. 14(a) shows variations in current here. Then, FIG. 14(b) shows the measurements of the phosphorus and oxygen concentrations obtained at the centers of the grown crystals along the pull axis. In FIGS. 14(a) and (b), the abscissas indicate the crystal pull length. Table 16 provides a summary of the crystal growth conditions and the variations in oxygen and boron concentrations.

TABLE 16

Magnetic Field Strength and Impurity Concentration Distribution in Embodiments 36–39

|  | Magnetic Field Strength (T) | Current (A) | Melt Rotation Rate (rpm) | Variation in Oxygen Conc. (%) | Variation in Phosphorus Conc. (%) |
|---|---|---|---|---|---|
| Embodiment 36 | 0.03 | 0.6–0.8 | 20–30 | <1 | <1 |
| Embodiment 37 | 0.05 | 0.5–0.7 | 30–38 | <1 | <1 |
| Embodiment 38 | 0.1 | 0.3–0.48 | 40–50 | <1 | <1 |
| Embodiment 39 | 0.3 | 0.2–0.42 | 60–90 | <1 | <1 |

Figure 15A:
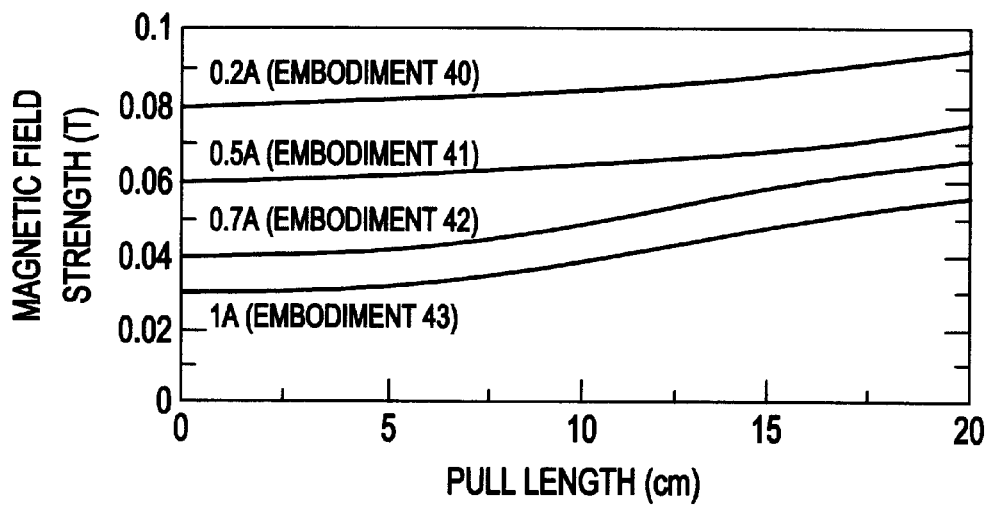
FIG. 15(a) is a graph showing the variations in applied magnetic field strength with respect to a change in crystal pull length, in embodiments 40–43 of the method according to the third invention.
Figure 15B:
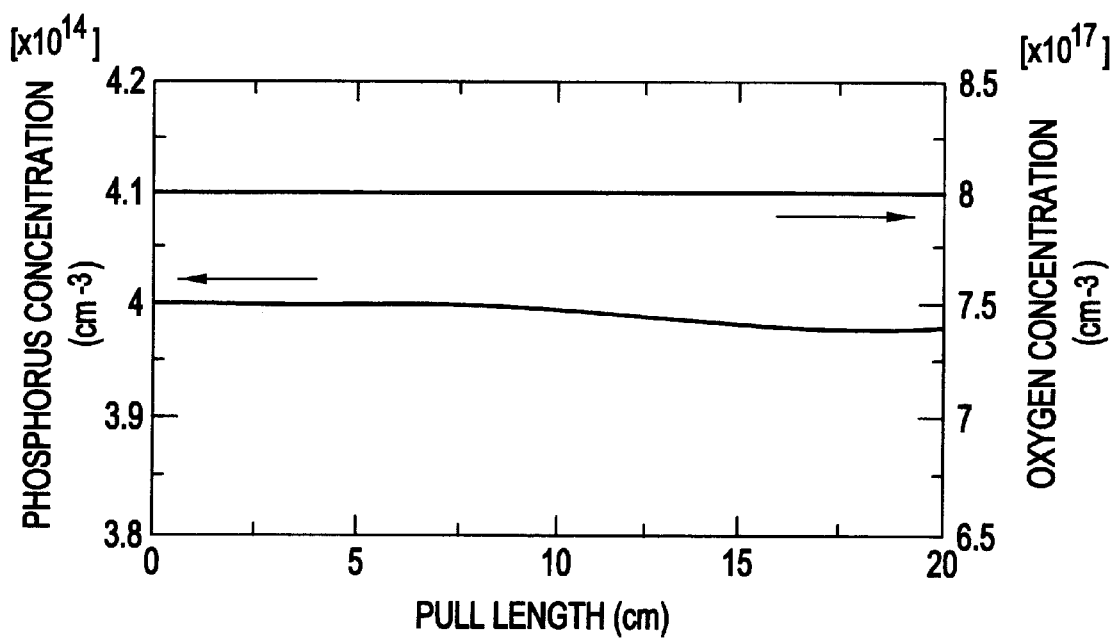
FIG. 15(b) is a graph showing the measurements of the phosphorus and oxygen concentrations obtained along the crystal pull axes at the crystal centers of the grown silicon single crystals, in the embodiments 40–43 of the method according to the third invention.

For the embodiments 40–43, the current was fixed to 0.2 A, 0.5 A, 0.7 A, and 1.0 A while the magnetic field strength was changed with the crystal pull length. FIG. 15(a) shows the magnetic field strength changed with the crystal pull length for each current. Then, FIG. 15(b) shows the concentrations of phosphorus and oxygen measured at the centers of the grown crystals along the pull axis. In FIGS. 15(a) and (b). the abscissas indicate the crystal pull length. Table 17 provides a summary of the crystal growth conditions and the variations in oxygen and phosphorus concentrations.

TABLE 17

Current and Impurity Concentration Distribution in Embodiments 40–43

|  | Current (A) | Magnetic Field Strength (T) | Melt Rotation Rate (rpm) | Variation in Oxygen Conc. (%) | Variation in Boron Conc. (%) |
|---|---|---|---|---|---|
| Embodiment 40 | 0.2 | 0.08–0.095 | 18–22 | <1 | <1 |
| Embodiment 41 | 0.5 | 0.06–0.075 | 30–46 | <1 | <1 |
| Embodiment 42 | 0.7 | 0.04–0.065 | 28–52 | <1 | <1 |
| Embodiment 43 | 1.0 | 0.03–0.055 | 30–58 | <1 | <1 |

Figure 16A:
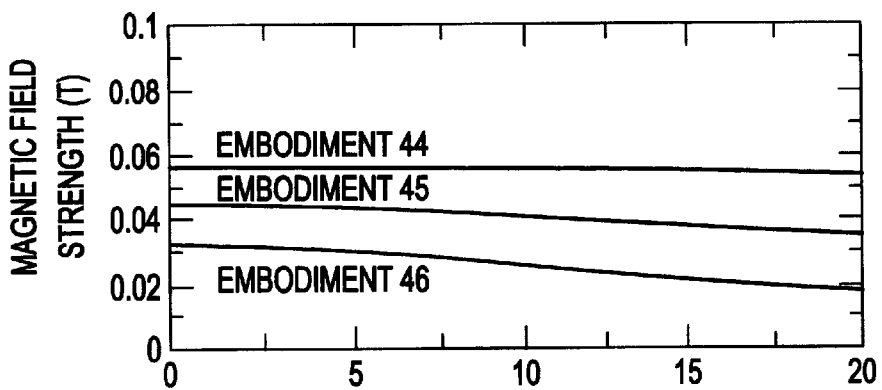
FIG. 16(a) is a graph showing the variations in applied magnetic field strength with respect to a change in crystal pull length, in embodiments 44–46 of the method according to the third invention.
Figure 16B:
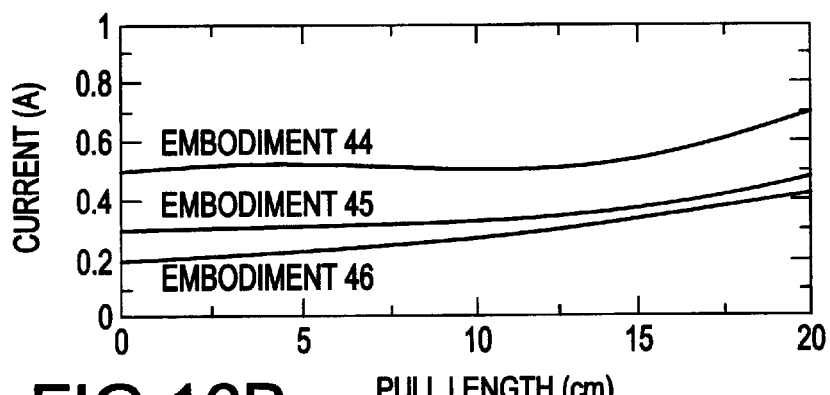
FIG. 16(b) is a graph showing the variations in applied current with respect a change in crystal pull length, in the embodiments 44–46 of the method according to the third invention.
Figure 16C:
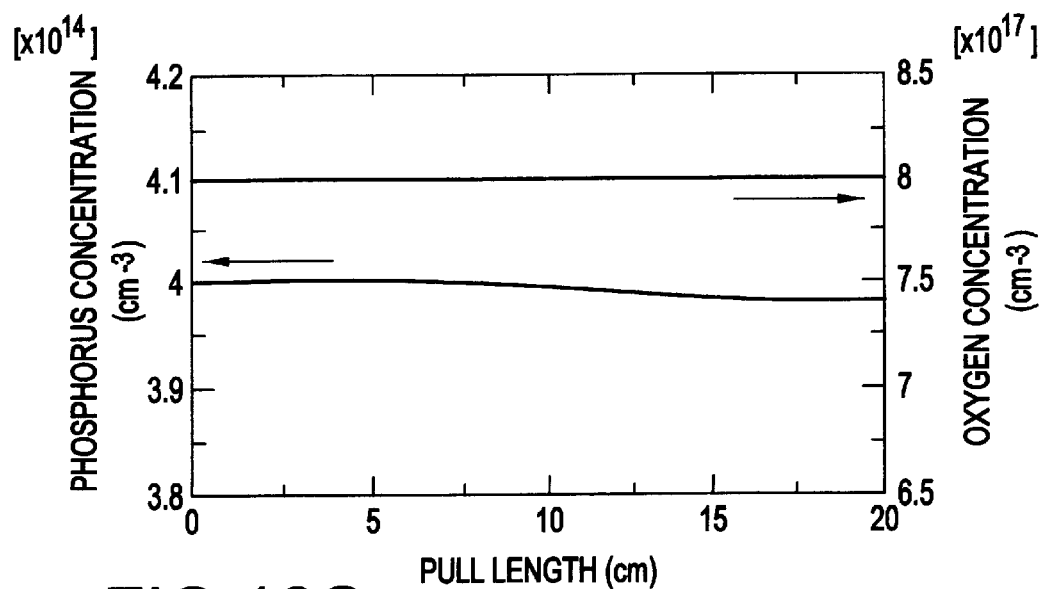
FIG. 16(c) is a graph showing the measurements of the phosphorus and oxygen concentrations obtained along the crystal pull axes at the crystal centers of the grown silicon single crystals, in the embodiments 44–46 of the method according to the third invention.

For the embodiments 44–46, both the applied current and magnetic field strength were changed with the crystal pull length. FIG. 16(a) shows the applied magnetic field strengths which were changed with the pulling time. FIG. 16(b) shows variations in current. FIG. 16(c) shows the concentrations of phosphorus and oxygen measured at the centers of the grown crystals along the pull shaft. In FIGS. 16(a), (b), and (c), the abscissas indicate the crystal pull length Table 18 provides a summary of the crystal growth conditions and the variations in oxygen and phosphorus concentrations.

TABLE 18

Current Magnetic Field Strength, and Impurity
Concentration Distribution in Embodiments 44–46

| | Magnetic Field Strength (T) | Current (A) | Melt Rotation Rate (rpm) | Variation in Oxygen Conc. (%) | Variation in Boron Conc. (%) |
|---|---|---|---|---|---|
| Embodiment 44 | 0.058–0.052 | 0.2–0.42 | 12–20 | <1 | <1 |
| Embodiment 45 | 0.045–0.035 | 0.3–0.48 | 13–18 | <1 | <1 |
| Embodiment 46 | 0.062–0.018 | 0.5–0.72 | 18–15 | <1 | <1 |

It was confirmed from the results of these the embodiments 36–46 that even if phosphorus is used as the dopant impurity, the method of the present invention allows the phosphorus concentration and the oxygen concentration in a silicon single crystal to have a uniform distribution with variations of not greater than 1% along the direction of growth. It was also confirmed that the method of the third invention allows a uniform distribution of impurities in a silicon single crystal irrespective of dopant type.

Now, the following describes results of the crystal growth by the method of the third invention with greater crystal diameters. For the embodiments 47–55, silicon single crystals of 20 cm in crystal diameter, doped with boron were grown. The crystal growth was conducted by making 200 kg of silicon melt in a quartz crucible of 60 cm in diameter. Three cylindrical silicon single crystals having a diameter of 0.5 cm were used as the electrodes for current application. They were immersed into the melt at such angles that they fall symmetric about the crystal pull axis. Moreover, these electrodes were arranged on a circumference 3 cm inside the crucible's inner wall.

Figure 17A:
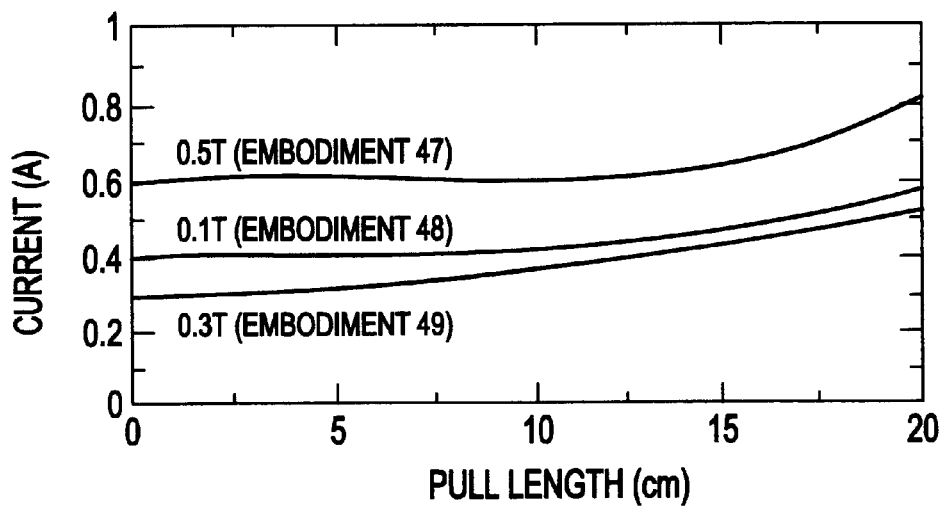
FIG. 17(a) is a graph showing the variations in applied current with respect to a change in crystal pull length, in embodiments 47–49 of the method according to the third invention.
Figure 17B:
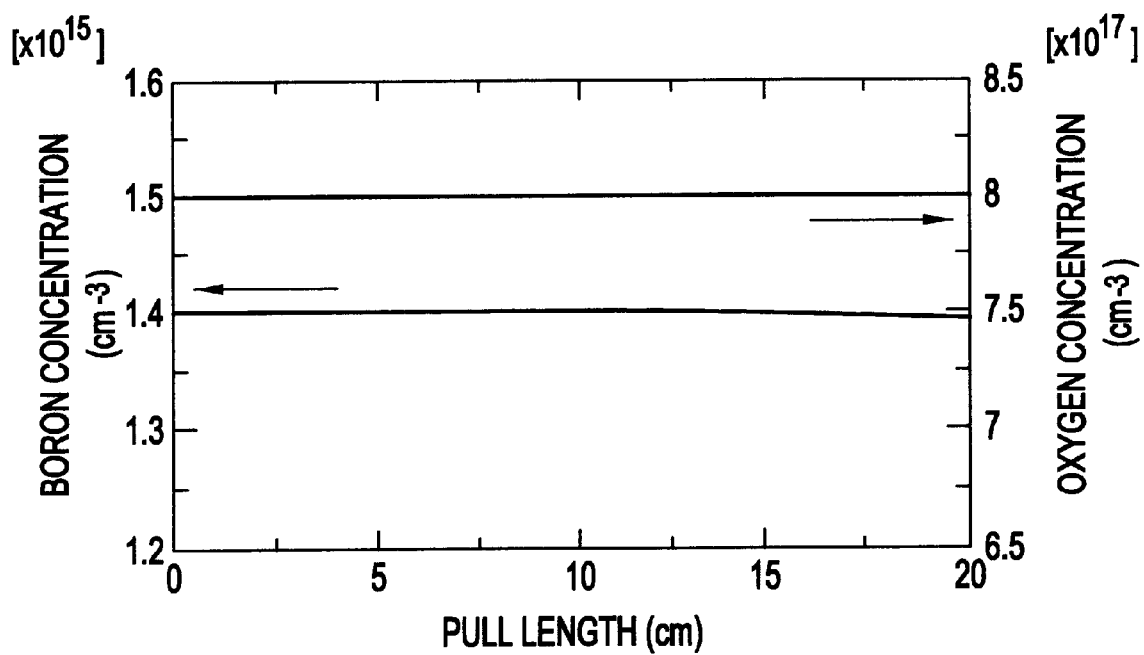
FIG. 17(b) is a graph showing the measurements of the boron and oxygen concentrations obtained along the crystal pull axes at the crystal centers of the grown silicon single crystals, in the embodiments 47–49 of the method according to the third invention.

In the embodiments 47–49, the applied magnetic field strength was fixed to 0.5 T, 0.1 T. and 0.3 T while the current was changed with the crystal pull length for crystal growth. FIG. 17(a) shows variations in current here. Additionally, FIG. 17(b) shows the measurements of the boron and oxygen concentrations obtained at the centers of the grown crystals along the pull axis. In FIGS. 17(a) and (b), the abscissas indicate the crystal pull length. Table 19 provides a summary of the crystal growth conditions and the variations in oxygen and boron concentrations.

TABLE 19

Magnetic Field Strength and Impurity Concentration
Distribution in Embodiments 47–49

| | Magnetic Field Strength (T) | Current (A) | Melt Rotation Rate (rpm) | Variation in Oxygen Conc. (%) | Variation in Boron Conc. (%) |
|---|---|---|---|---|---|
| Embodiment 47 | 0.05 | 0.6–0.7 | 32–40 | <1 | <1 |
| Embodiment 48 | 0.1 | 0.4–0.58 | 42–60 | <1 | <1 |
| Embodiment 49 | 0.3 | 0.3–0.52 | 90–115 | <1 | <1 |

Figure 18A:
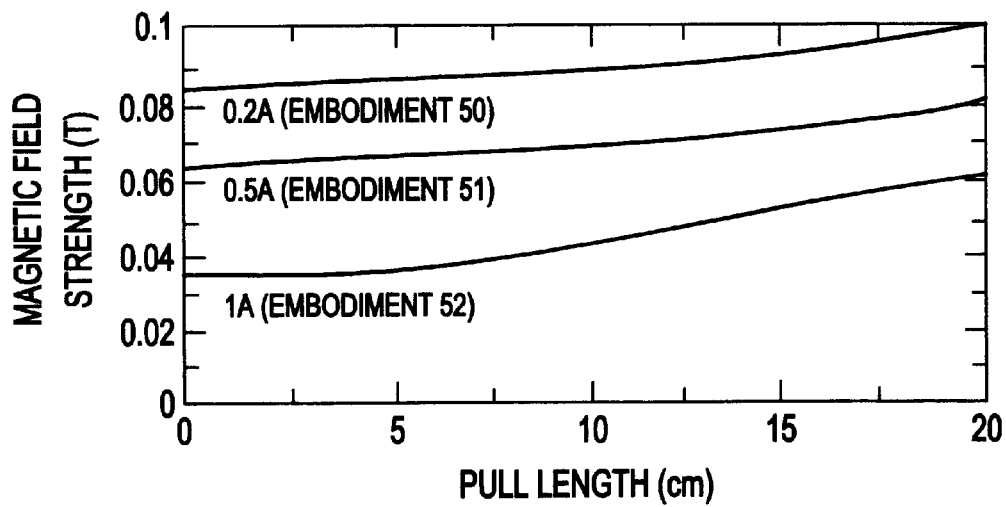
FIG. 18(a) is a graph showing the variations in applied magnetic field strength with respect to a change in crystal pull length, in embodiments 50–52 of the method according to the third invention.
Figure 18B:
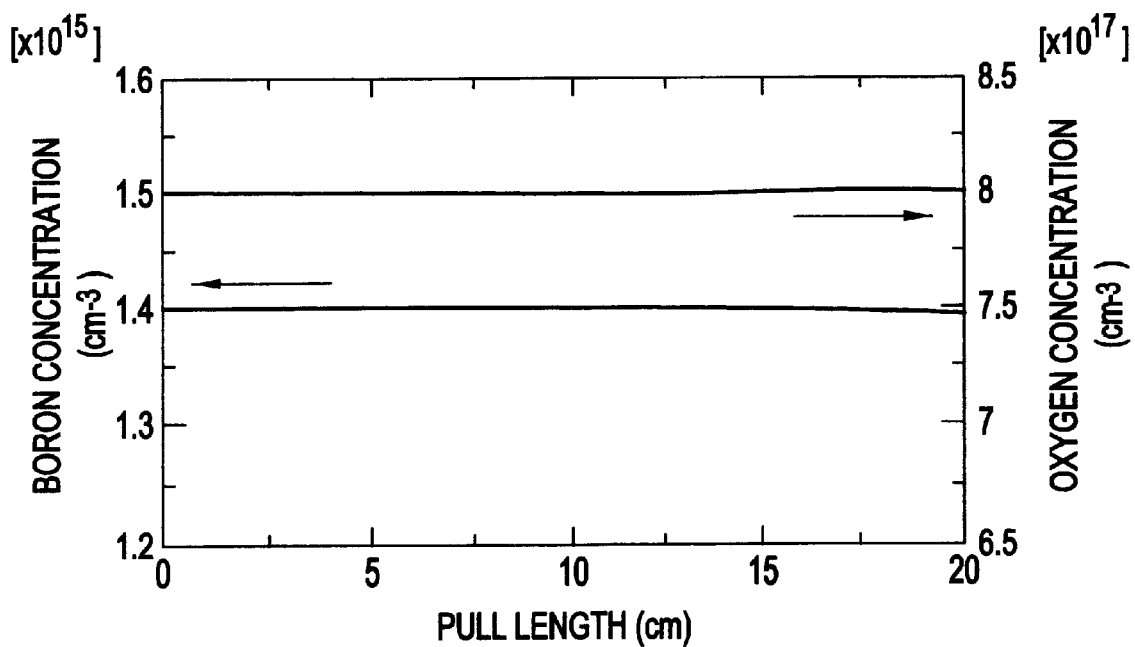
FIG. 18(b) is a graph showing the measurements of the phosphorus and oxygen concentrations obtained along the crystal pull axes at the crystal centers of the grown silicon single crystals, in the embodiments 50–52 of the method according to the third invention.

In the embodiments 50–52, the current was fixed to 0.2 A, 0.5 A, and 1A while the applied magnetic field strength was changed with the crystal pull length. FIG. 18(a) shows the magnetic field strength changed with the crystal pull length for each fixed current. Then, FIG. 18(b) shows the concentrations of boron and oxygen measured at the centers of the grown crystals along the pull axis. In FIGS. 18(a) and (b), the abscissas indicate the crystal pull length. Table 20 provides a summary of the crystal growth conditions and the variations in oxygen and boron concentrations.

TABLE 20

Current and Impurity Concentration Distribution in
Embodiments 50–52

| | Current (A) | Magnetic Field Strength (T) | Melt Rotation Rate (rpm) | Variation in Oxygen Conc. (%) | Variation in Boron Conc. (%) |
|---|---|---|---|---|---|
| Embodiment 50 | 0.2 | 0.085–0.1 | 18–22 | <1 | <1 |
| Embodiment 51 | 0.5 | 0.064–0.08 | 32–42 | <1 | <1 |
| Embodiment 52 | 1.0 | 0.038–0.06 | 40–63 | <1 | <1 |

Figure 19A:
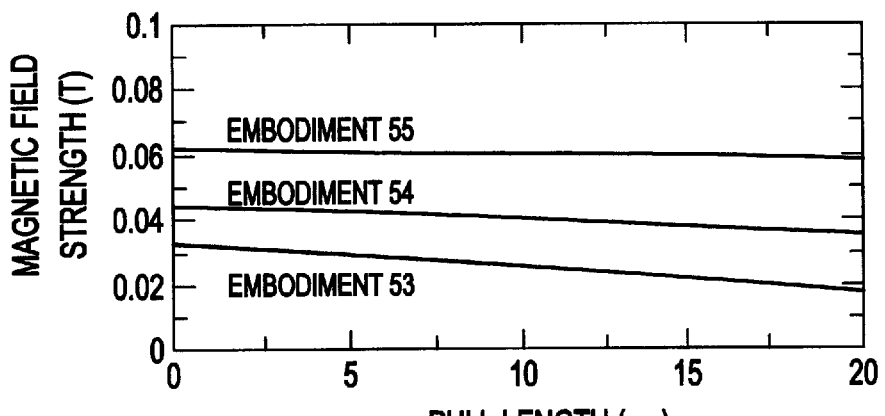
FIG. 19(a) is a graph showing the variations in applied current and in applied magnetic field strength with respect to a change in crystal pull length, in embodiments 53–55 of the method according to the third invention.
Figure 19B:
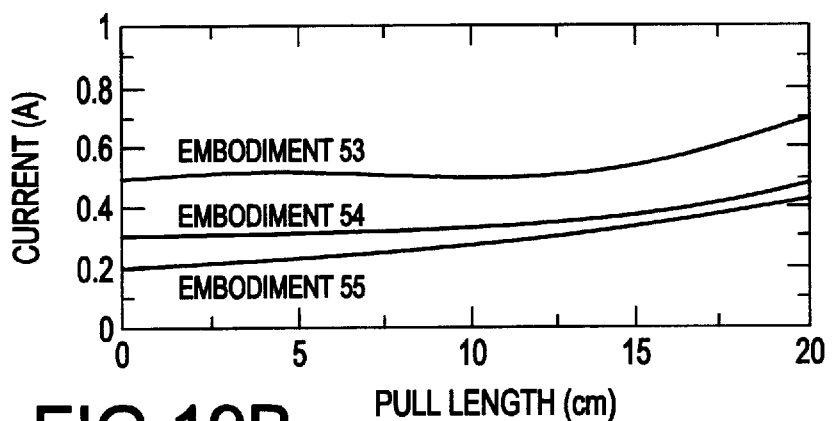
FIG. 19(b) is a graph showing the variations in applied current and in applied magnetic field strength with respect to a change in crystal pull length, in the embodiments 53–55 of the method according to the third invention.
Figure 19C:
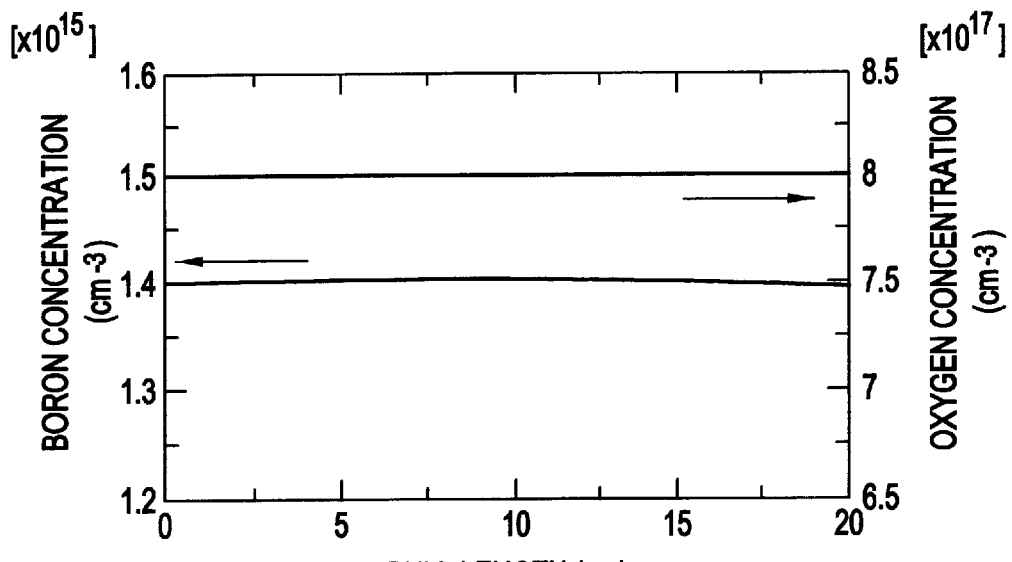
FIG. 19(c) is a graph showing the measurements of the phosphorus and oxygen concentrations obtained along the crystal pull axes at the crystal centers of the grown silicon single crystals, in the embodiments 53–55 of the method according to the third invention.

In the embodiments 53–55, the method of changing both the current and the magnetic field strength with the crystal pull length was employed. FIG. 19(a) shows variations in the applied magnetic field strength which is changed with the pulling time. FIG. 19(b) shows variations in current FIG. 19(c) shows the concentrations of boron and oxygen measured at the centers of the grown crystals along the pull axis. In FIGS. 19(a), (b), and (c), the abscissas indicate the crystal pull length. Table 21 provides a summary of the crystal growth conditions and the variations in oxygen and boron concentrations.

TABLE 21

Magnetic Field and Current, and Impurity
Concentration Distribution in Embodiments 53–55

| | Magnetic Field Strength (T) | Current (A) | Melt Rotation Rate (rpm) | Variation in Oxygen Conc. (%) | Variation in Boron Conc. (%) |
|---|---|---|---|---|---|
| Embodiment 53 | 0.032–0.018 | 0.5–0.72 | 18–15 | <1 | <1 |
| Embodiment 54 | 0.05–0.035 | 0.3–0.48 | 18–20 | <1 | <1 |
| Embodiment 55 | 0.062–0.059 | 0.2–0.42 | 15–25 | <1 | <1 |

It was confirmed from the results of these the embodiments 47–55 that even in the cases of a 20-cm-diameter silicon single crystal, the method of the third invention allows the boron concentration and oxygen concentration in the crystal to have a uniform distribution with variations of not greater than 1% along the direction of growth.

Furthermore, the following describes results of the crystal growth by the method of the third invention for silicon single crystals of 40 cm in crystal diameter For the embodiments 56–64, silicon single crystals of 40 cm in crystal diameter, doped with boron were grown. The crystal growth was conducted by making 400 kg of silicon melt in a quartz crucible of 120 cm in diameter. Three cylindrical silicon single crystals having a diameter of 1 cm were used as the electrodes for current application. They were immersed into the melt at such angles that they fall symmetric about the crystal pull axis. Moreover, these electrodes were arranged on a circumference 5 cm inside the crucible's inner wall.

Figure 20A:
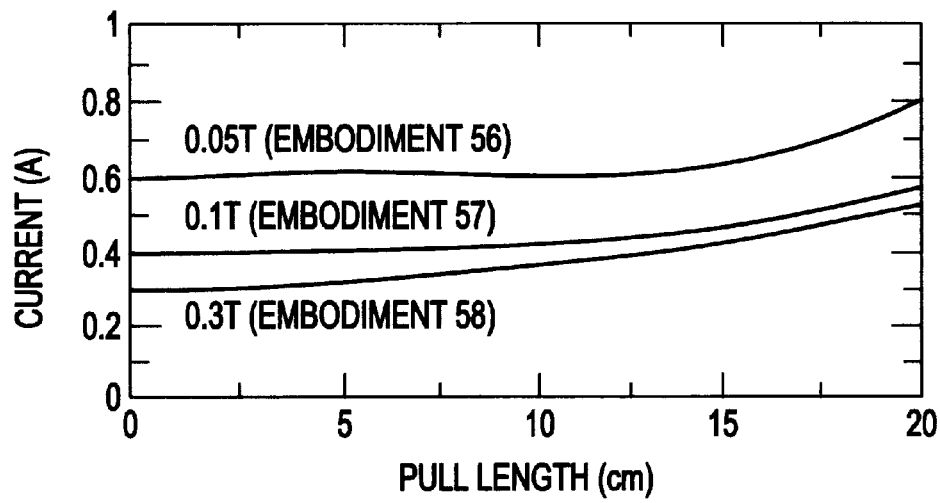
FIG. 20(a) is a graph showing the variations in applied current with respect to a change in crystal pull length, in embodiments 56–58 of the method according to the third invention.
Figure 20B:
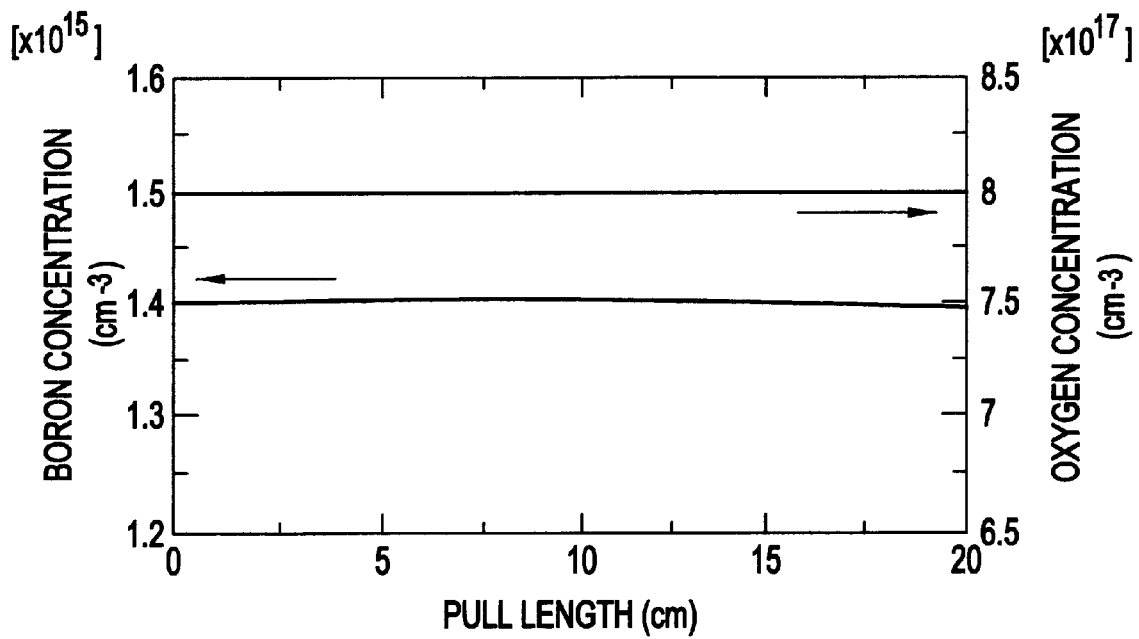
FIG. 20(b) is a graph showing the measurements of the phosphorus and oxygen concentrations obtained along the crystal pull axes at the crystal centers of the grown silicon single crystals, in the embodiments 56–58 of the method according to the third invention.

In the embodiments 56–58, the applied magnetic field strength was fixed to 0.5 T, 0.1 T. and 0.3 T while the current was changed with the crystal pull length for crystal growth, FIG. 20(a) shows variations in current here. In this diagram, the variations in current are plotted over the crystal pull length. Additionally, FIG. 20(b) shows the measurements of the boron and oxygen concentrations obtained at the centers of the grown crystals along the pull axis. In FIGS. 20(a) and (b), the abscissas indicate the crystal pull length. Table 22 provides a summary of the crystal growth conditions and the variations in oxygen and boron concentrations.

TABLE 22

Magnetic Field Strength, and Impurity Concentration Distribution in Embodiments 56–58

| | Magnetic Field Strength (T) | Current (A) | Melt Rotation Rate (rpm) | Variation in Oxygen Conc. (%) | Variation in Boron Conc. (%) |
|---|---|---|---|---|---|
| Embodiment 56 | 0.05 | 0.6–0.82 | 32–42 | <1 | <1 |
| Embodiment 57 | 0.1 | 0.4–0.58 | 42–58 | <1 | <1 |
| Embodiment 58 | 0.3 | 0.3–0.52 | 82–118 | <1 | <1 |

Figure 21A:
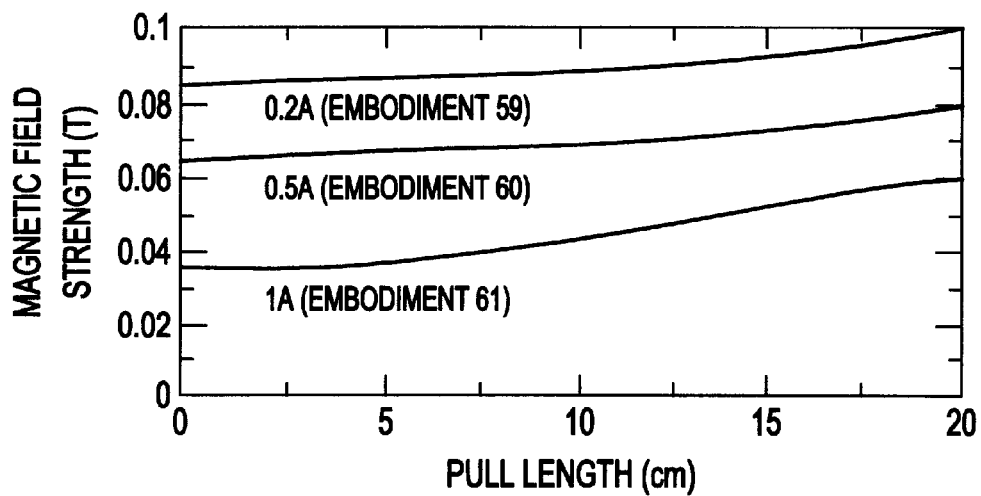
FIG. 21(a) is a graph showing the variations in applied magnetic field strength with respect to a change in crystal pull length, in embodiments 59–61 of the method according to the third invention.
Figure 21B:
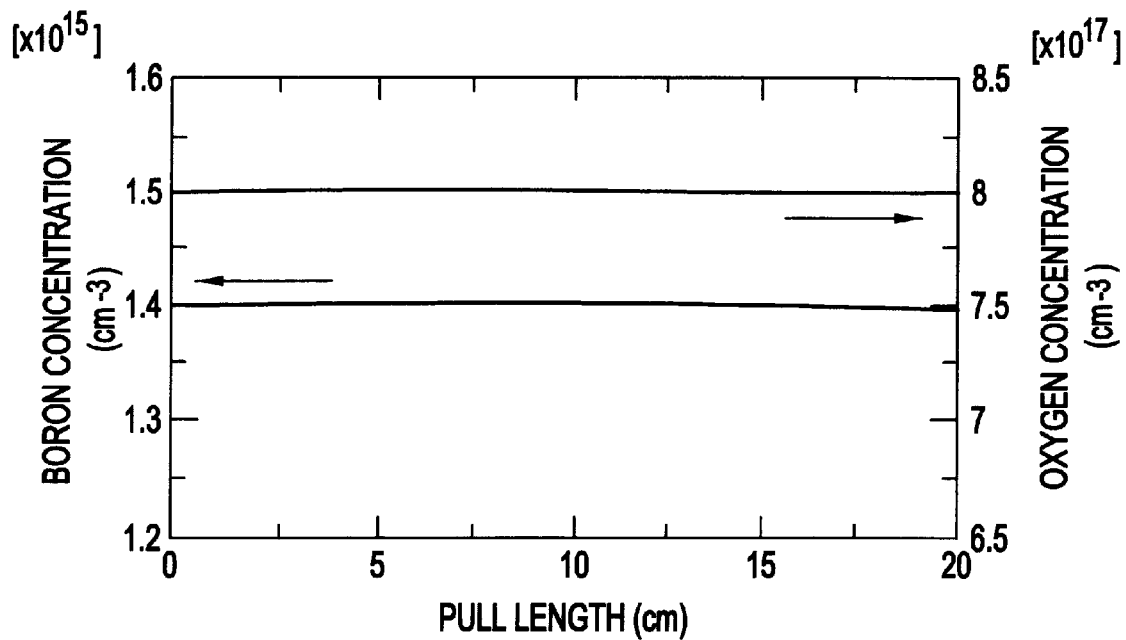
FIG. 21(b) is a graph showing the measurements of the boron and oxygen concentrations obtained along the crystal pull axes at the crystal centers of the grown silicon single crystals, in the embodiments 59–61 of the method according to the third invention.

In the embodiments 59–61, the current was fixed to 0.2 A, 0.5 A, and 1A while the applied magnetic field strength was changed with the crystal pull length. FIG. 21(a) shows the magnetic field strength changed with the crystal pull length for each fixed current. Then, FIG. 21(b) shows the concentrations of boron and oxygen measured at the centers of the grown crystals along the pull axis. In FIGS. 21(a3) and (b), the abscissas indicate the crystal pull length. Table 23 provides a summary of the crystal growth conditions and the variations In oxygen and boron concentrations.

TABLE 23

Current and Impurity Concentration Distribution in Embodiments 59–61

| | Current (A) | Magnetic Field Strength (T) | Melt Rotation Rate (rpm) | Variation in Oxygen Conc. (%) | Variation in Boron Conc. (%) |
|---|---|---|---|---|---|
| Embodiment 59 | 0.2 | 0.084–0.1 | 18–22 | <1 | <1 |
| Embodiment 60 | 0.5 | 0.065–0.08 | 28–42 | <1 | <1 |
| Embodiment 61 | 1.0 | 0.038–0.06 | 40–60 | <1 | <1 |

Figure 22A:
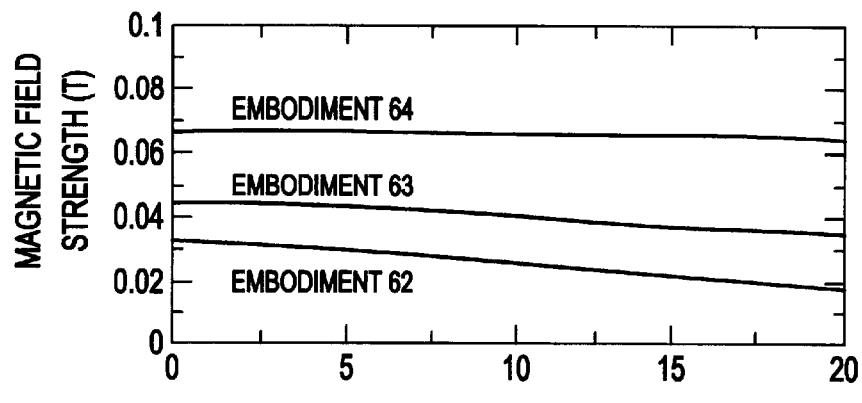
FIG. 22(a) is a graph showing the variations in applied magnetic field strength with respect to a change in crystal pull length, in embodiments 62–64 of the method according to the third invention.
Figure 22B:
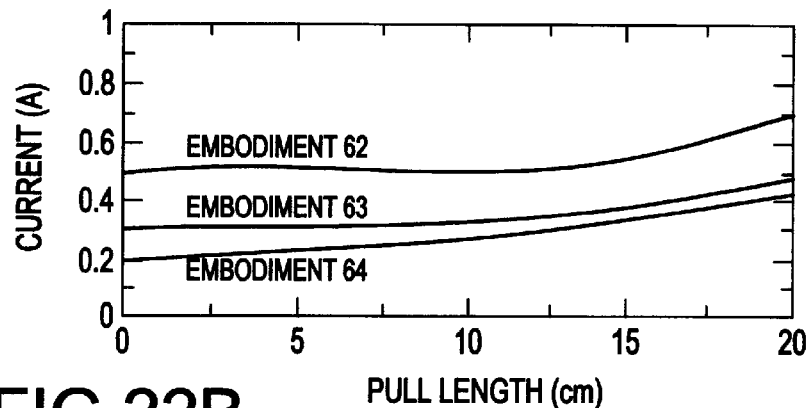
FIG. 22(b) is a graph showing the variations In applied current with respect to a change in crystal pull length, in the embodiments 62–64 of the method according to the third invention.
Figure 22C:
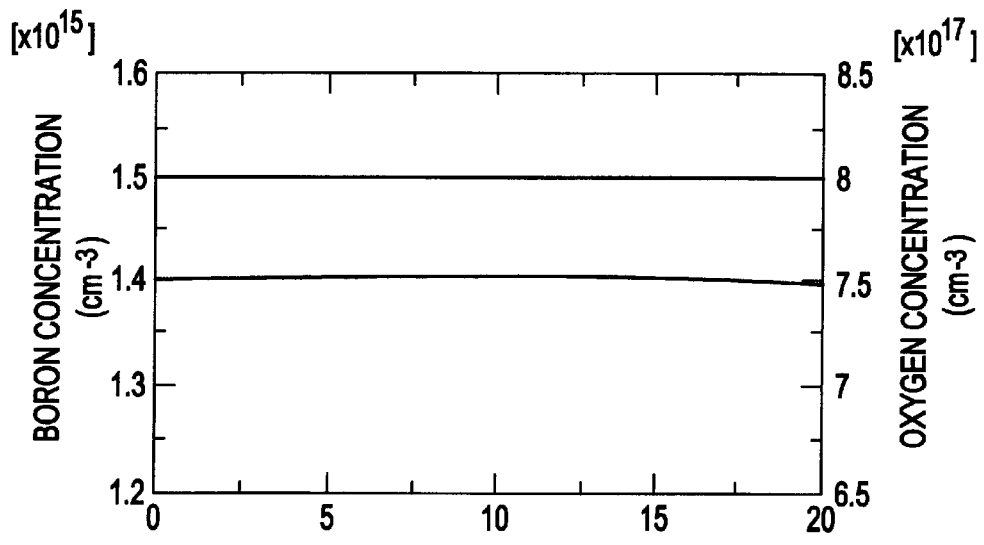
FIG. 22(c) is a graph showing the measurements of the boron and oxygen concentrations obtained along the crystal pull axes at the crystal centers of the grown silicon single crystals, in the embodiments 62–64 of the method according to the third invention.

In the embodiments 62–64, methods of changing both the current and the magnetic field strength with the crystal pull length were employed. FIG. 22(a) shows the applied magnetic field strengths which were changed with the pulling time. FIG. 22(b) shows variations in current. FIG. 22(c) shows the concentrations of boron and oxygen measured at the centers of the grown crystals along the pull axis. In FIGS. 22(a), (b), and (c), the abscissas indicate the crystal pull length. Table 24 provides a summary of the crystal growth conditions and the variations in oxygen and boron concentrations.

TABLE 24

Magnetic Field Strength and Current, and Impurity Concentration Distribution in Embodiments 62–64

| | Magnetic Field Strength (T) | Current (A) | Melt Rotation Rate (rpm) | Variation in Oxygen Conc. (%) | Variation in Boron Conc. (%) |
|---|---|---|---|---|---|
| Embodiment 62 | 0.032–0.018 | 0.5–0.72 | 18–15 | <1 | <1 |
| Embodiment 63 | 0.05–0.038 | 0.3–0.48 | 16–20 | <1 | <1 |
| Embodiment 64 | 0.068–0.062 | 0.2–0.42 | 10–28 | <1 | <1 |

It was confirmed from the results of these embodiments 56–64 that even when a 40-cm-diameter silicon single crystal is grown, the method of the third invention allows the boron concentration and oxygen concentration in the crystal to have a uniform distribution with variations of not greater than 1% along the direction of growth.

For the comparative embodiments 12–22 of the third invention, silicon single crystals of 20 cm and 40 cm in diameter were grown by a conventional mechanical method of rotating the crucible The crystal growth, in the cases of 20-cm-diameter crystals, was conducted by making 200 kg of silicon melt In a quarts crucible of 60 cm in diameter and rotating the crucible within a range of 1-20 rpm. In the cases of 40-cm-diameter crystals, 400 kg of silicon melt was made in a quartz crucible of 120 cm in diameter, and the crucible was rotated at rotation rates in the range of 1–20 rpm. Table 25 collectively shows the results.

TABLE 25

Crystal Growth Conditions and Impurity Concentration Distribution in Comparative Examples 12–21

| | Crystal Diameter (cm) | Rotation Rate of Crucible (rpm) | Variation in Oxygen Conc. (%) | Variation in Boron Conc. (%) |
|---|---|---|---|---|
| Comparative Example 12 | 20 | 0.5 | 10 | 20 |
| Comparative Example 13 | 20 | 1 | 5 | 10 |
| Comparative Example 14 | 20 | 5 | 5 | 7 |
| Comparative Example 15 | 20 | 10 | 2 | 5 |
| Comparative Example 16 | 20 | 15 | 1.5 | 2 |
| Comparative Example 17 | 40 | 0.5 | 20 | 25 |
| Comparative Example 18 | 40 | 1 | 12 | 15 |
| Comparative Example 19 | 40 | 5 | 6 | 10 |
| Comparative Example 20 | 40 | 10 | 5 | 7 |
| Comparative Example 21 | 40 | 15 | 2 | 4 |

Furthermore, for the comparative examples 22–31, silicon single crystals of 20 cm in diameter, doped with boron were grown under a magnetic field and a current of constant intensities. The crystal growth was conducted by making 200 kg of silicon melt in a quartz crucible of 60 cm in diameter Three cylindrical silicon single crystals having a diameter of 0.5 cm were used as the electrodes for current application. They were immersed into the melt at such angles that they fall symmetric about the crystal pull axis. Moreover, these electrodes were arranged on a circumference 3 cm inside the crucible's inner wall. Table 26 provides a summary of the crystal growth conditions and the variations in oxygen and boron concentrations.

TABLE 26

Crystal Growth Conditions and Impurity Concentration
Distribution in Comparative Examples 22–31

| | Applied Magnetic Field Strength (T) | Current (A) | Melt Rotation Rate (rpm) | Variation in Oxygen Conc. (%) | Variation in Boron Conc. (%) |
|---|---|---|---|---|---|
| Comparative Example 22 | 0.03 | 1.0 | 40 | 5 | 7 |
| Comparative Example 23 | 0.03 | 2.0 | 50 | 5 | 5 |
| Comparative Example 24 | 0.05 | 0.5 | 18 | 5 | 7 |
| Comparative Example 25 | 0.05 | 1.0 | 45 | 2 | 5 |
| Comparative Example 26 | 0.05 | 2.0 | 70 | 1.5 | 2 |
| Comparative Example 27 | 0.1 | 0.2 | 15 | 7 | 7 |
| Comparative Example 28 | 0.1 | 0.5 | 25 | 5 | 5 |
| Comparative Example 29 | 0.1 | 1.0 | 60 | 5 | 3 |
| Comparative Example 30 | 0.3 | 0.2 | 25 | 5 | 5 |
| Comparative Example 31 | 0.3 | 0.5 | 60 | 2 | 3 |

Additionally, for the comparative examples 32–41, silicon single crystals of 40 cm in diameter, doped with boron were grown under a magnetic field and a current of constant intensities. The crystal growth was conducted by making 400 kg of silicon melt in a quartz crucible of 120 cm in diameter. Three cylindrical silicon single crystals having a diameter of 0.5 cm were used as the electrodes for current application. These were immersed into the melt at such angles that they fall symmetric about the crystal pull axis. Moreover, these electrodes were arranged on a circumference 3 cm inside the crucible's inner wall. Table 27 provides a summary of the crystal growth conditions and the variations in oxygen and boron concentrations.

TABLE 27

Crystal Growth Conditions and Impurity Concentration
Distribution in Comparative Examples 32–41

| | Applied Magnetic Field Strength (T) | Current (A) | Melt Rotation Rate (rpm) | Variation in Oxygen Conc. (%) | Variation in Boron Conc. (%) |
|---|---|---|---|---|---|
| Comparative Example 32 | 0.05 | 0.5 | 18 | 5 | 7 |
| Comparative Example 33 | 0.05 | 1.0 | 45 | 5 | 5 |
| Comparative Example 34 | 0.05 | 2.0 | 70 | 5 | 7 |
| Comparative Example 35 | 0.1 | 0.5 | 25 | 2 | 5 |
| Comparative Example 36 | 0.1 | 1.0 | 60 | 1.5 | 2 |
| Comparative Example 37 | 0.1 | 2.0 | 120 | 7 | 7 |
| Comparative Example 38 | 0.2 | 0.5 | 75 | 5 | 5 |
| Comparative Example 39 | 0.2 | 1.0 | 100 | 5 | 3 |
| Comparative Example 40 | 0.5 | 1.0 | 20 | 5 | 5 |
| Comparative Example 41 | 0.5 | 2.0 | 30 | 2 | 3 |

It can be seen from the results of the comparative examples 22–41 that when crystals are grown under a magnetic field and a current of constant intensities, the oxygen concentration and dopant impurity concentration in the grown silicon single crystals falls at or above 1% in the distribution unevenness along the direction of growth, and the oxygen and dopant impurity concentrations are difficult to uniformize. This confirms that changing the magnetic field strength and the current with the crystal pull length as in the third invention makes it possible to grow crystals which are large in diameter yet uniform in impurity distribution.

Next, in order to confirm that the third invention is applicable to the growth of semiconductor single crystals other than silicon, GaAs single crystals of 15 cm in diameter were grown, as the embodiments 65 through 67, in a p-BN (pyrolytio-BornNitride) crucible of 30 cm in diameter. Three GaAs single crystals having a diameter of 0.5 cm were used as the electrodes for current application. The electrodes were arranged at such angles and positions that they fall symmetric about the crystal pull axis, on a concentric circle 1 cm inside the crucible's inner wall. In the crystal growth, an appropriate amount of silicon was added as a dopant so that the resistivity falls at 10 Ωcm. In the embodiment 65, the magnetic field applied was fixed to 0.05 T while the current was changed with the crystal pull length. In the embodiment 66, the current was fixed to 1.0 A while the applied magnetic field strength was changed with the crystal pull length. In the embodiment 67, both the current and the magnetic field strength were changed with the crystal pull length. As for these embodiments, Table 28 provides a summary of the crystal growth conditions and the measurements of the dopant impurity, or silicon, concentration at crystal center obtained in the direction of the pull axis.

TABLE 28

Crystal Growth Conditions and Impurity Concentration
Distribution in Embodiments 65–67

| | Magnetic Field Strength (T) | Current (A) | Melt Rotation Rate (rpm) | Variation in Silicon Conc. (%) |
|---|---|---|---|---|
| Embodiment 65 | 0.05 | 0.2–0.42 | 8–18 | <1 |
| Embodiment 66 | 0.02–0.04 | 1.0 | 18–36 | <1 |
| Embodiment 67 | 0.04–0.02 | 0.2–0.42 | 4–16 | <1 |

Besides, for the embodiments 68 through 70, InP single crystals of 10 cm in diameter were grown in a p-BN crucible of 20 cm in diameter. In this case, an appropriate amount of antimony was also added as a dopant so that the crystal has a resistivity of 10 Ωcm. Three InP single crystals having a diameter of 0.5 cm were used as the electrodes for current application. The electrodes were arranged at such angles and positions that they fall symmetric about the crystal pull axis, on a concentric circle 1 cm inside the crucible's inner wall. In the embodiment 68, the magnetic field applied was fixed to 0.05 T while the current was changed with the crystal pull length. In the embodiment 69, the current was fixed to 1.0 A while the applied magnetic field strength was changed with the crystal pull length. In the embodiment 70, both the current and the magnetic field strength were changed with the crystal pull length. As for these, embodiments, Table 29 provides a summary of the crystal growth conditions and the measurements of the dopant impurity, or antimony, concentration at crystal center obtained in the direction of the pull axis.

TABLE 29

Crystal Growth Conditions and Impurity Concentration Distribution in Embodiments 68–70

|  | Magnetic Field Strength (T) | Current (A) | Melt Rotation Rate (rpm) | Variation in Silicon Conc. (%) |
| --- | --- | --- | --- | --- |
| Embodiment 65 | 0.05 | 0.2–0.42 | 10–18 | <1 |
| Embodiment 66 | 0.02–0.04 | 1.0 | 18–36 | <1 |
| Embodiment 67 | 0.04–0.02 | 0.2–0.42 | 8–10 | <1 |

It is confirmed from the above-mentioned results that even when semiconductor single crystals other than silicon is grown, the third invention makes it possible to grow uniform semiconductor single crystals of not greater than 1% in impurity concentration distribution In the crystal pulling direction.

In the third invention, the applied magnetic field strength and the current, as well as their respective variations against the crystal pull length, are not limited to the above embodiments. The third invention covers all methods in which the applied magnetic field strength and the current are changed with the crystal pull length or the crystal pull time.

What is claimed is:

1. A semiconductor crystal growing method for growing a semiconductor crystal by using a semiconductor crystal growing apparatus comprising a device for applying a magnetic field to inside a semiconductor melt and a device for passing a current through the semiconductor melt, the method being characterized in that the semiconductor crystal growing apparatus has an electrode for applying the current to inside the semiconductor melt, the electrode extending through a tube surrounding the electrode.

2. A semiconductor crystal growing method according to claim 1, characterized in that before the electrode and the melt are put into contact with each other, a part of the electrode is exposed from an opening in the tube surrounding the electrode.

3. A semiconductor crystal growing method according to claim 1, characterized in that during crystal growth, the contact portion between the electrode and the melt lies inner than an opening in the tube surrounding the electrode.

4. A semiconductor crystal growing method according to claim 1, characterized in that during crystal growth, the position of the tube surrounding the electrode is controlled so that an opening in the tube is always in contact with the melt.

5. A semiconductor single crystal growing method for performing semiconductor single crystal growth by Czochralski method, characterized by using a semiconductor single crystal growing apparatus having a device for applying a magnetic field to inside a semiconductor melt and a device for passing a current orthogonal to the magnetic field through the semiconductor melt, a float for rotating with the melt being arranged on the surface of the semiconductor melt, and in that the movement of the float for rotating with the melt is detected to monitor the state of rotation of the semiconductor melt with the movement.

6. A semiconductor crystal growing method using Czochralski method, for applying a magnetic field and a current orthogonal to each other to inside a semiconductor melt, characterized in that the magnetic field applied is changed during crystal growth.

7. A semiconductor crystal growing method according to claim 6, characterized in that the magnetic field applied is changed in accordance with a crystal pull length during crystal growth.

8. A semiconductor crystal growing method according to claim 6, characterized in that the magnetic field applied is changed in accordance with a crystal pull time during crystal growth.

9. A semiconductor crystal growing method according to claim 6, characterized in that both the magnetic field applied and the current applied are changed during crystal growth.

10. A semiconductor crystal growing method according to claim 6, characterized in that a magnetic field signal parameter to change is the strength of the magnetic field.

11. A semiconductor crystal growing method using Czochralski method, for applying a magnetic field and a current orthogonal to each other to inside a semiconductor melt, characterized in that the current applied is changed during crystal growth.

12. A semiconductor crystal growing method according to claim 11, characterized in that the current applied is changed in accordance with a crystal pull length during crystal growth.

13. A semiconductor crystal growing method according to claim 11, characterized in that the current applied is changed in accordance with a crystal pull time during crystal growth.

14. A semiconductor crystal growing method according to claim 11, characterized in that a current signal parameter to change is the value of the current.

15. A semiconductor crystal growing apparatus comprising a device for applying a magnetic field to inside a semiconductor melt and a device for passing a current through the semiconductor melt, characterized in that an electrode for applying the current to inside the semiconductor melt extends through a tube surrounding the electrode.

16. A semiconductor crystal growing apparatus according to claim 15, characterized in that the material of the tube surrounding the electrode is the same as that of a crucible for holding the semiconductor melt.

17. A semiconductor crystal growing apparatus according to claim 15, characterized in that one end of the tube surrounding the electrode is opened so that the electrode and the melt make contact with each other, and the other end of the tube is provided with a mechanism for holding the electrode and a mechanism for energizing the electrode.

18. A semiconductor crystal growing apparatus according to claim 15, characterized in that the inner diameter of the tube surrounding the electrode is greater than the diameter of the electrode.

19. A semiconductor crystal growing apparatus according to claim 15, characterized in that an air vent is arranged in part of the tube surrounding the electrode.

20. A semiconductor crystal growing apparatus according to claim 1, characterized in that the electrode and the tube surrounding the electrode are provided in a plurality of pairs.

21. A semiconductor crystal growing apparatus according to claim 20, characterized in that the plurality of pairs of the electrode and the tube surrounding the electrode are arranged symmetrically about a crystal pull axis.

22. A semiconductor single crystal growing apparatus for performing semiconductor single crystal growth by Czochralski method, comprising a device for applying a magnetic field to inside a semiconductor melt and a device for passing a current orthogonal to the magnetic field through the semiconductor melt, characterized in that a float for rotating with the melt is arranged on the surface of the semiconductor melt.

23. A semiconductor single crystal growing apparatus according to claim 22, characterized in that the float has the shape of a ring.

24. A semiconductor single crystal growing apparatus according to claim 23, characterized in that the ring of the ring-shaped float is provided with a deformed portion.

25. A semiconductor single crystal growing apparatus according to claim 24, characterized in that the deformed portion is arranged on the outer periphery of the ring.

26. A semiconductor single crystal growing apparatus according to claim 24, characterized in that the deformed portion is arranged on the top surface of the ring.

27. A semiconductor, single crystal growing apparatus according to claim 24, characterized in that the deformed portion is protruded from the ring.

28. A semiconductor single crystal growing apparatus according to claim 24, characterized in that the deformed portion is a recess in the ring.

29. A semiconductor single crystal growing apparatus according to claim characterized in that the deformed portion is a hole piercing through the ring.

30. A semiconductor single crystal growing apparatus according to claim 22, characterized in that a ring-shaped float is arranged so that a growing crystal grows inside the ring of the float.

31. A semiconductor single crystal growing apparatus according to claim 22, characterized in that the material of the float is the same as that of a crucible for holding the semiconductor melt.

32. A semiconductor crystal growing apparatus using Czochralski method, comprising a device for applying a magnetic field and a current orthogonal to each other to inside a semiconductor melt, characterized by providing a magnetic field control unit for changing the magnetic field during crystal pulling.

33. A semiconductor crystal growing apparatus using Czochralski method, comprising a device for applying a magnetic field and a current orthogonal to each other to inside a semiconductor melt, characterized by providing a current control unit for changing the current during crystal pulling.

* * * * *